US012725674B2

(12) United States Patent
Tian et al.

(10) Patent No.: US 12,725,674 B2
(45) Date of Patent: Sep. 1, 2026

(54) DIE LEVEL FAILURE RECOVERY

(71) Applicant: Sandisk Technologies, Inc., Milpitas, CA (US)

(72) Inventors: Xuan Tian, Shanghai (CN); Liang Li, Shanghai (CN); Tsingfa Li, Shanghai (CN); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 115 days.

(21) Appl. No.: 18/886,461

(22) Filed: Sep. 16, 2024

(65) Prior Publication Data

US 2026/0080964 A1 Mar. 19, 2026

(51) Int. Cl.
*G11C 29/12* (2006.01)
*G11C 29/46* (2006.01)

(52) U.S. Cl.
CPC .... *G11C 29/1201* (2013.01); *G11C 29/12005* (2013.01); *G11C 29/46* (2013.01)

(58) Field of Classification Search
CPC .......... G11C 29/1201; G11C 29/12005; G11C 29/46
USPC .................................................. 365/200, 201
See application file for complete search history.

(56) References Cited

U.S. PATENT DOCUMENTS 6,684,173 B2 * 1/2004 Kessenich .............. G11C 29/50 702/81
6,859,397 B2 2/2005 Lutze et al.
7,050,343 B2 * 5/2006 Kumar ................... G11C 29/16 365/201
7,218,552 B1 * 5/2007 Wan ..................... G11C 16/349 365/185.17
8,077,524 B2 * 12/2011 Lutze .................. G11C 11/5635 365/185.27
9,104,591 B2 8/2015 Tam
9,460,805 B1 10/2016 Pang et al.
9,905,307 B1 * 2/2018 Ghai ...................... H10B 63/84
10,467,093 B2 11/2019 Werner et al.
10,957,394 B1 3/2021 Chen et al.
11,081,179 B2 8/2021 Yang
(Continued)

OTHER PUBLICATIONS

International Search Report & The Written Report of the International Searching Authority dated Aug. 22, 2025, International Application No. PCT/US2025/027075.

*Primary Examiner* — Michael T Tran
(74) *Attorney, Agent, or Firm* — Pearl Cohen LLP

(57) ABSTRACT

Programming techniques disclosed herein may be used to recover from potential plane and/or die level failures. The memory system may detect evidence of a plane or die level failure that impacts memory operations performed in a target region of the blocks if a first programming technique is used in the target region. For example, the memory system may note that a significant number of blocks have memory operation failures in the target region. The storage system switches to a second programming technique for programming the target region responsive to detecting evidence of a plane or die level failure. The blocks may be tested for a reliability criterion after programming using the second programming technique in the target region of the block. The second programming technique may overcome the plane or die level failure such that blocks may continue to be used with the second programming technique.

19 Claims, 18 Drawing Sheets

(56) References Cited

U.S. PATENT DOCUMENTS

| | | | | |
|---|---|---|---|---|
| 11,347,403 | B2 | 5/2022 | Mehta et al. | |
| 2008/0117684 | A1* | 5/2008 | Hemink | G11C 16/3404<br>365/185.19 |
| 2011/0292724 | A1 | 12/2011 | Kim | |
| 2016/0247912 | A1 | 8/2016 | Ujiie | |
| 2020/0202926 | A1 | 6/2020 | Chiang | |
| 2021/0247912 | A1 | 8/2021 | Elyasi et al. | |
| 2023/0041476 | A1 | 2/2023 | Yang et al. | |

* cited by examiner

Storage System 100
Memory Controller 120
Storage
130
Memory Interface
160
ECC Engine
158
Processor
156
NOC
154
Local Memory Controller
164
local memory
140
Host Interface
152
Host
102

207
211
201
208
206
memory
structure
202
row decoder
222
array drivers
224
block select
226
row control circuitry 220
column decoder
212
driver circuitry
214
block select
216
column control circuitry 210
R/W Circuits
225
Control Die
System Control Logic
260
State Machine
262
Storage
266
Power Control
264
Interface
268
row address signals
control signals
control signals
column address signals
Memory Controller 207
201
280
282
282
276
211
284
284
278
201
284
282
282
276
211
284
284
280
278
201
282
282
276
211
284
280
278
271
274
272

To NAND strings
BL3
BL2
BL1
BL0
225
225
225
225
325
Comparison circuit 320
Sense node latch 322
Managing Circuit 330
340
ADL
BDL
CDL
346
336
352
348
XDL
I/O Interface 332
334
Data of memory cells
E
P
Vt
Vev
Vr
Vv
Er
A
B
C
D
E
F
G
Vt
Vev
VrA
VvA
VrB
VvB
VrC
VvC
VrD
VvD
VrE
VvE
VrF
VvF
VrG
VvG Figure 8
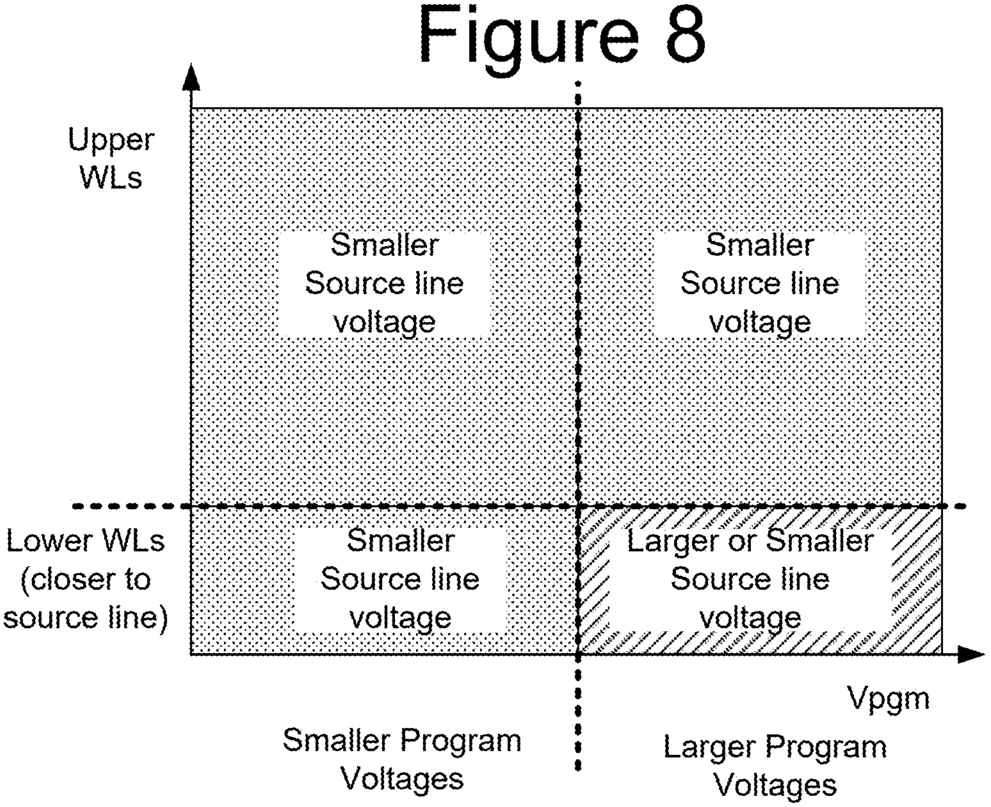
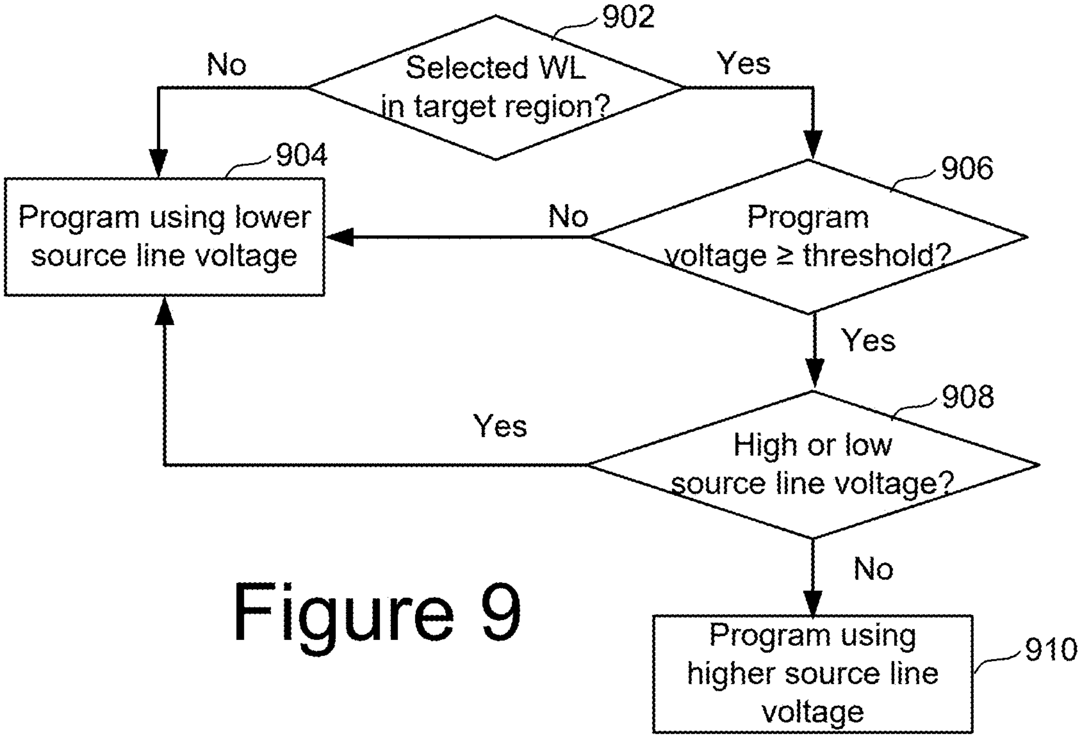
Figure 9

1200

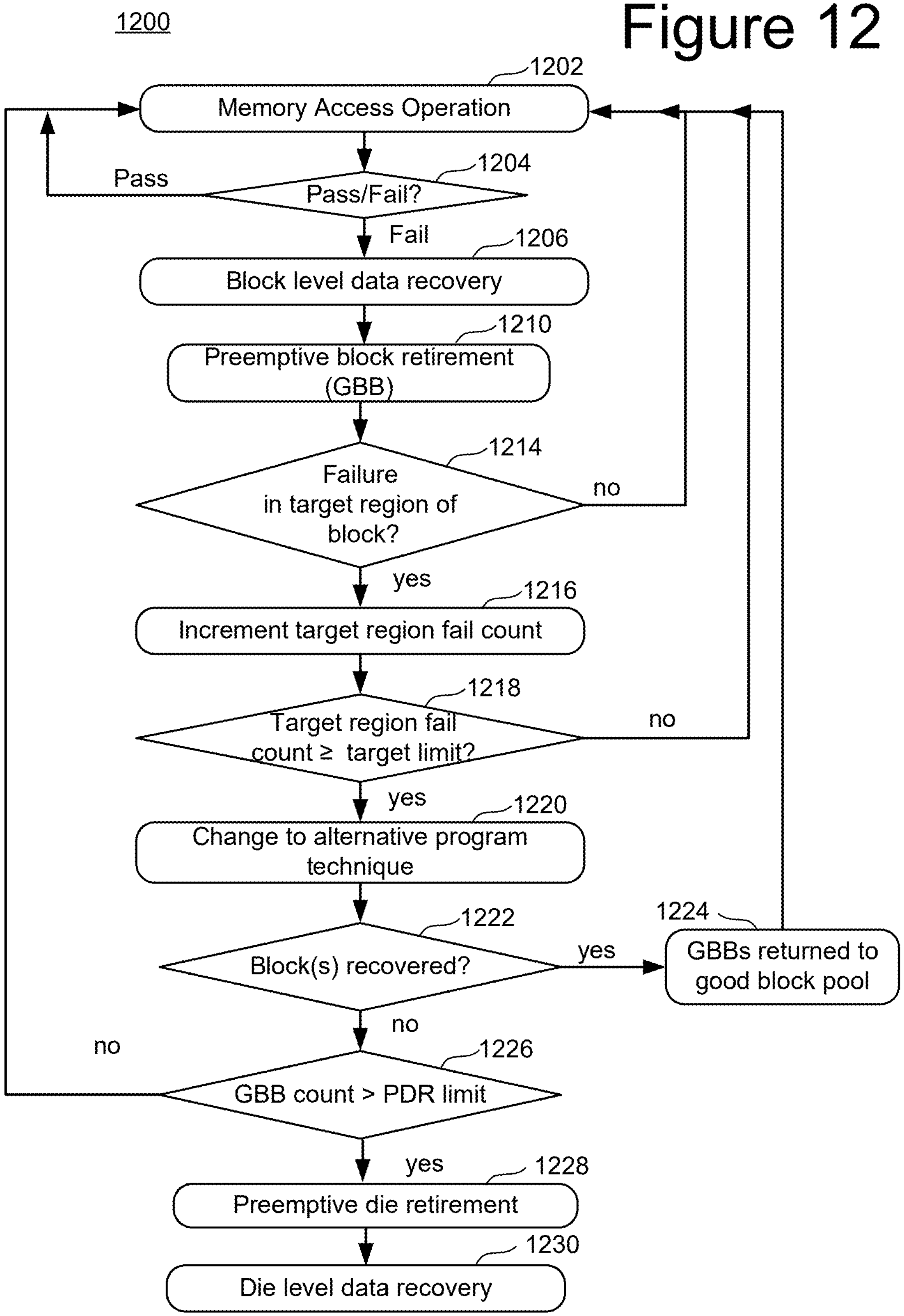

Figure 12
1202
Memory Access Operation
1204
Pass
Pass/Fail?
Fail
1206
Block level data recovery
1210
Preemptive block retirement (GBB)
1214
Failure in target region of block?
no
yes
1216
Increment target region fail count
1218
Target region fail count ≥ target limit?
no
yes
1220
Change to alternative program technique
1222
Block(s) recovered?
yes
1224
GBBs returned to good block pool
no
1226
no
GBB count > PDR limit
yes
1228
Preemptive die retirement
1230
Die level data recovery

DIE LEVEL FAILURE RECOVERY

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

Modern storage systems such as, for example, solid state drives typically contain a number of semiconductor dies with each die containing memory cells such as NAND strings. Each die may contain one or more planes with each plane containing a large number of blocks. Each block contains a large number of memory cells such as NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block. The block is associated with a source line. The source side select gates are used to connect or disconnect the NAND channels from the source line.

The memory cells are programmed one group at a time. The unit of programming is typically referred to as a page. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

Once the memory cells in the memory device have been programmed, data may be read from the memory cells by sensing the programmed states of the memory cells. However, sensed states can sometimes vary from the written states due to one or more factors. Error detection and correction decoding can be used to detect and correct data errors resulting from sensed states that do not match written states. Typically, the user data is encoded as ECC (error correction code) codewords prior to programming. Therefore, an ECC engine may be used to correct errors in the encoded user data. However, there is a limit as to how many bits in the data read from the memory cells can be in error in order for the ECC algorithm to successfully correct all errors. Therefore, storage systems typically do not rely only on correcting errors in ECC codewords.

Many storage systems employ one or more techniques to recover from block level failures such as the failure to decode ECC codewords programmed into that block. One technique to recover from a block level failure is to dynamically adjust (i.e., calibrate) the read reference voltages and then re-read the memory cells with the calibrated read reference voltages. Another technique to recover from a block level failure is to use XOR data to provide for block level redundancy. In addition to storing the ECC codewords in the non-volatile storage system, the system may compute and store XOR data. One technique is to accumulate XOR data based on successive bitwise exclusive OR (XOR) operations of the data that is programmed into the memory cells of a block. For example, initially a bitwise XOR is performed between the first two units of data that are programmed into the memory cells to form the initial XOR accumulation. Then, as each additional unit of data is programmed in the block, a bitwise XOR is performed between the current XOR accumulation and the new unit of data being programmed. The XOR data may be used to recover the user data in the event that the ECC decoder fails to decode one or more ECC codewords in the block, which is referred to herein as an unrecoverable by ECC decoder error (UECC). However, there are limits to how much user data within a block can be recovered using XOR data in the event of an UECC.

Thus, XOR data may be used for block level redundancy to recover from a block level failure. Many storage systems can recover from such block level failures, but cannot recover from a die level failure. Some storage systems will pre-emptively retire bad blocks to reduce the chance of a die level failure. In some cases, the storage system may resort to a read only mode to prevent a die level failure. In rare cases a die level failure could result in data loss.

Other storage systems provide for recovery from a die level failure with redundancy coding at, for example, a plane or die level One example of redundancy coding is commonly referred to as RAID (Redundant Array of Independent Disks). Redundancy coding may be used as an additional level of data integrity protection for the data being written into the non-volatile storage system. Redundancy coding typically involves storing the data across multiple planes, dies, disks, or other regions for increased data integrity in the event of a failure in one plane, one die, one disk, etc. However, die level redundancy reduces the storage capacity of the storage system. Also, substantial time is consumed recovering the data due to all of the data across the dies that needs to be read to recover the data that could not be read.

BRIEF DESCRIPTION OF THE DRAWINGS

Like-numbered elements refer to common components in the different figures.

FIG. 8 shows how the magnitude of the source line voltage correlates with location of the selected word line, the magnitude of the program voltage and whether the block has been identified as a candidate for retirement.

FIG. 9 is a flowchart of one embodiment of a process of programming memory cells.

FIG. 12 is a flowchart of one embodiment of a process of recovering blocks that are candidates for retirement with die level recovery.

DETAILED DESCRIPTION

Figure 1:
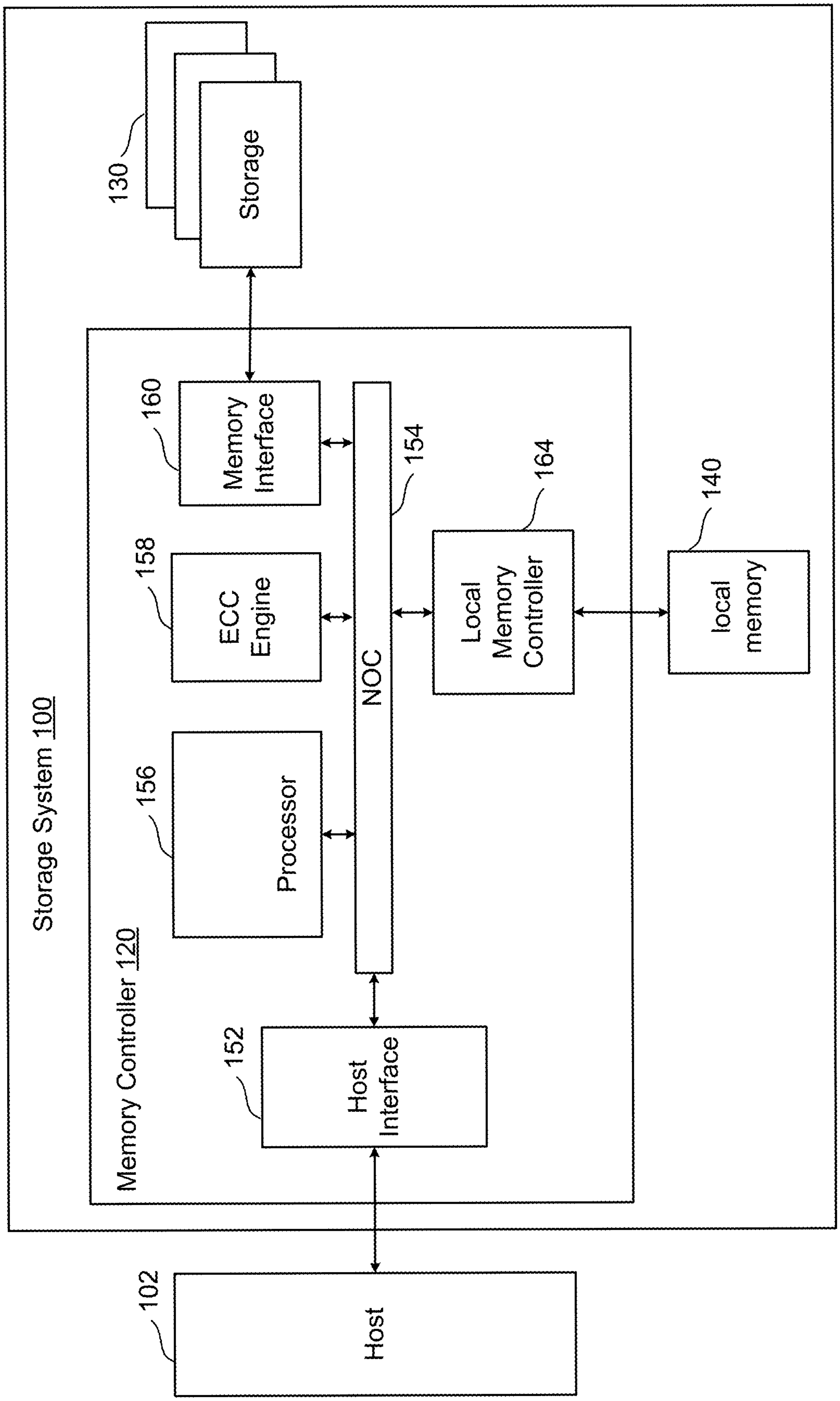
FIG. 1 is a block diagram depicting one embodiment of a storage system.

Technology is disclosed for programming NAND memory. Programming techniques disclosed herein may be used to recover from potential plane and/or die level failures. The blocks containing the NAND strings have different physical characteristics in different regions of the blocks, which may lead to preferences for different programming techniques in different regions. However, a programming technique that is preferable at one point in time may become problematic at another point in time due to, for example, a defect that develops outside of the blocks of memory cells. Therefore, the defect may potentially result in a plane or die level failure. An embodiment of a storage system uses a first programming technique when programming a target region of memory blocks so long as the first programming technique does not result in a significant number block level failures within the target region. The memory system may detect evidence of a plane or die level failure that impacts the memory operations performed in the target region of the blocks. For example, the memory system may detect that a significant number of blocks have memory operation failures in the target region. Some of the blocks may be identified as candidates for retirement following using first programming technique due to, for example, memory operation failures in the target region. The candidates for retirement may be based on a block level failure such as a failure to decode pages of data read from a block. However, the storage system may attempt to continue to use at least some of the blocks that are candidates for retirement. For at least some of the blocks that are candidates for retirement ("candidate blocks") the storage system switches to a second programming technique when programming the region of the blocks. The candidates blocks may be tested for a reliability criterion after programming using the second programming technique when programming the region of the block. Candidates blocks that pass the reliability criterion after programming using the second programming technique may continue to be used even though they were candidates for retirement. For those candidate blocks that continue to be used the storage system may use the second programming technique when programming the target region of the block. Moreover, the storage system may also use the second programming technique when programming the target region of other blocks that may also be impacted by the plane or die level issue.

In an embodiment, the first programming technique includes applying a first voltage to a source line and the second programming technique includes applying a second voltage to the source line. The second voltage may be lower than the first voltage. The first voltage may provide a higher pre-charge of NAND channels than the second voltage, thereby potentially improving the inhibiting of programming of memory cells that are to not receive programming. However, the circuitry that provides the first voltage may be more susceptible to a defect than the circuitry that provides the second voltage. Such a defect could result in errors when using the first voltage to pre-charge the NAND channels. Such errors could result in blocks being unusable. However, switching to the circuitry that provides the second voltage for pre-charging the NAND channels may allow the blocks to continue to be used.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
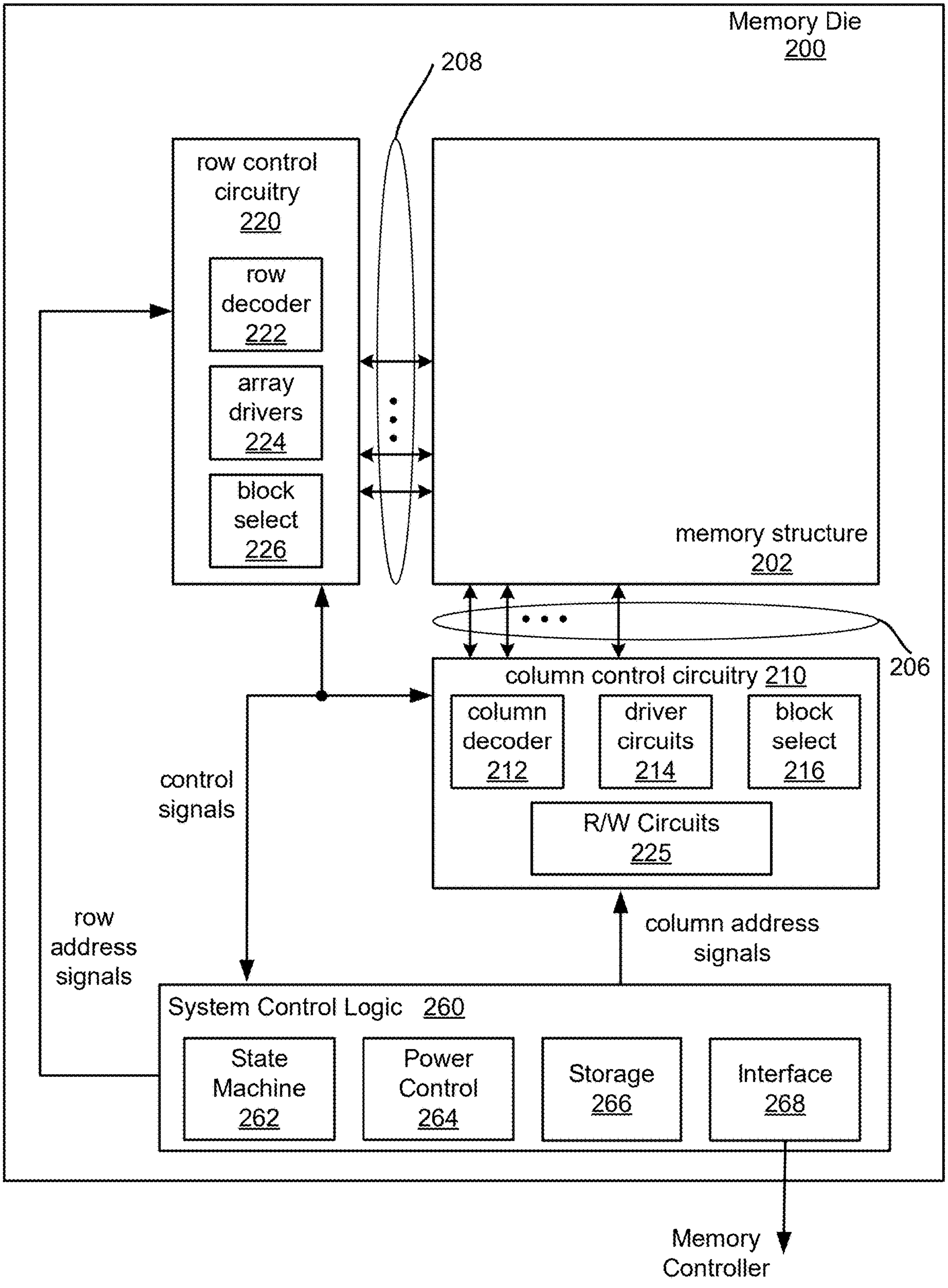
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuity 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
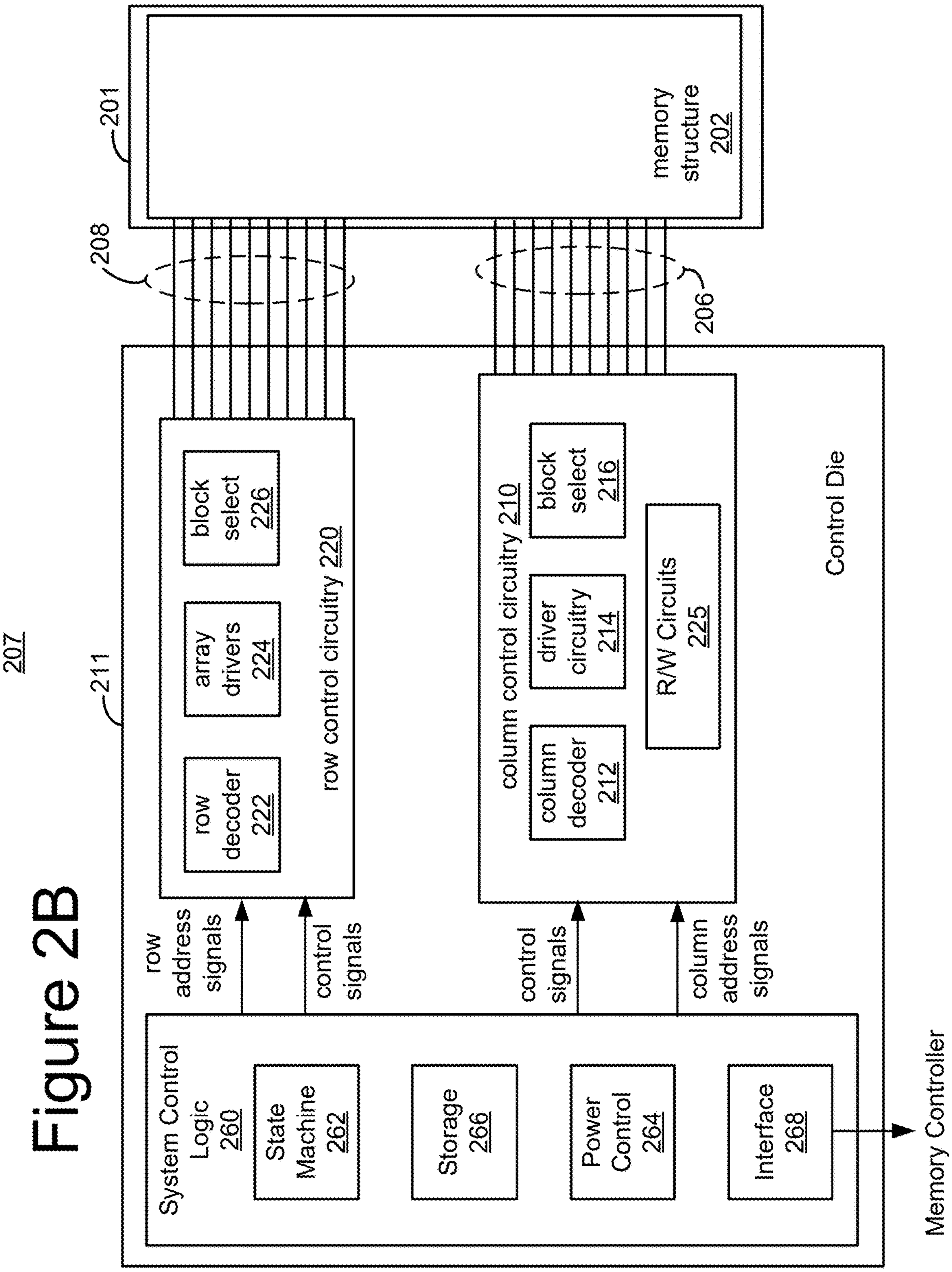
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a micro-controller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
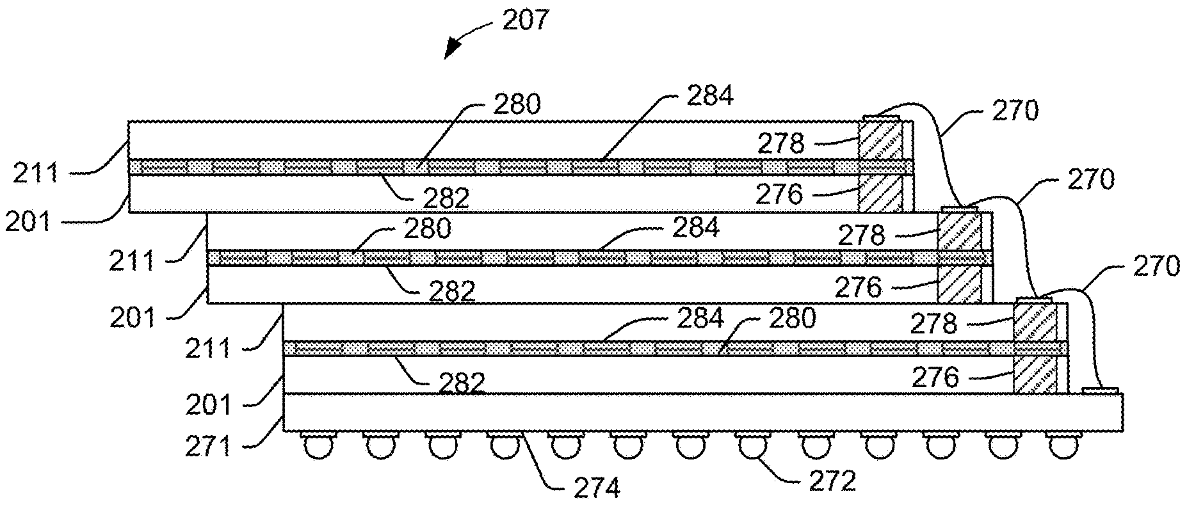
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
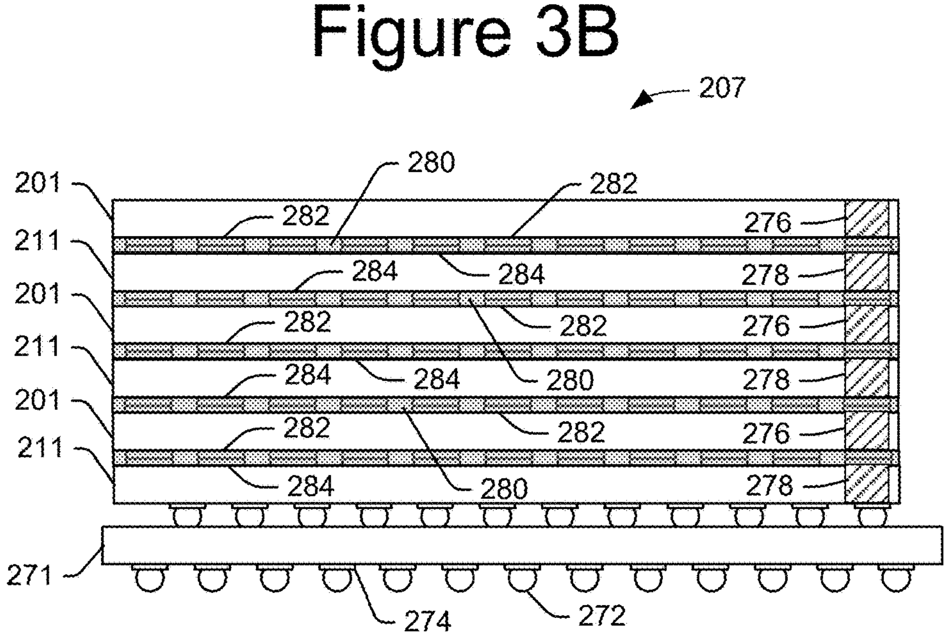

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
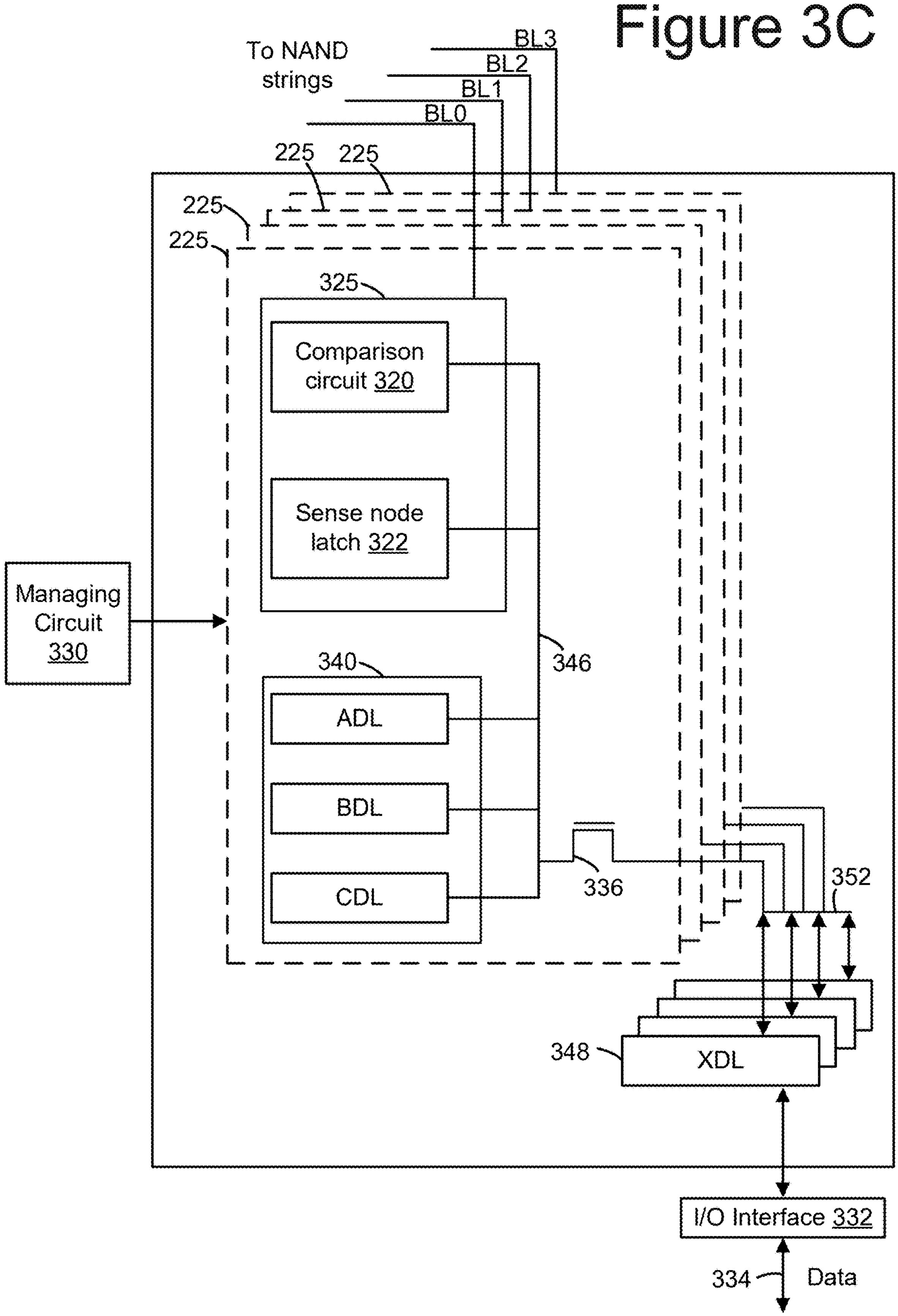
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the program verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
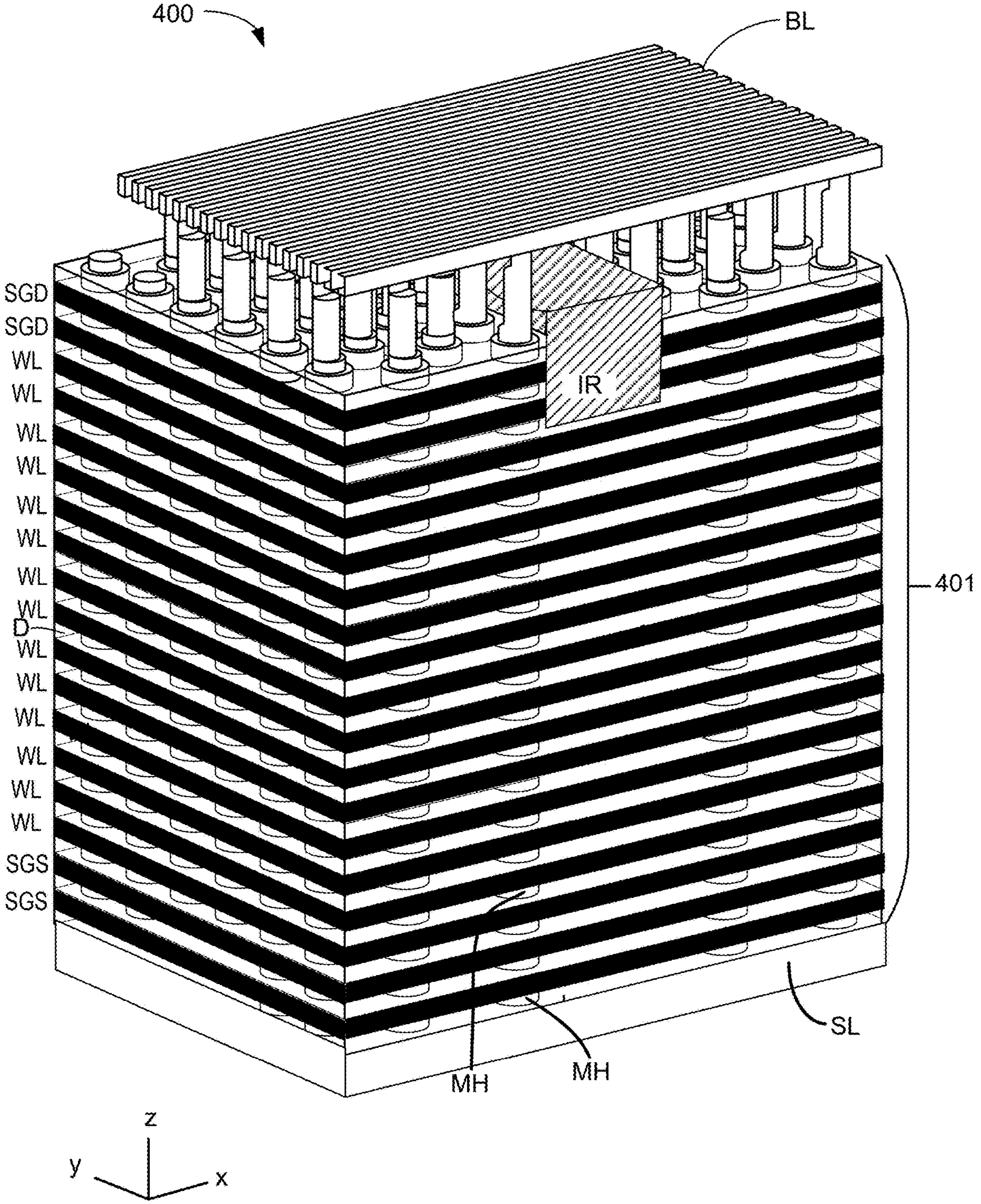
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D. The conductive layers are labeled as one of: SGD, WL, or SGS. An SGD conductive layer serves as drain side select lines. A WL conductive layer serves as a word line. An SGS conductive layer serves as a source side select line. The numbers of each of these conductive layers is limited for ease of illustration. The number of alternating dielectric layers and conductive layers can vary based on specific implementation requirements. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

In one embodiment the block is operated as a number of “sub-blocks.” Each of these “sub-blocks” has many NAND strings. In an embodiment, an isolation region (IR) divides the SGD layers into multiple SGD select lines, each of which is used to select a string (e.g., set of NAND strings). FIG. 4 depicts an example having one IR region and thereby two strings. However, there may be more than one IR region and thereby more than two strings. Optionally, the IR region can extend down through all of the alternating dielectric layers and conductive layers.

Figure 4A:
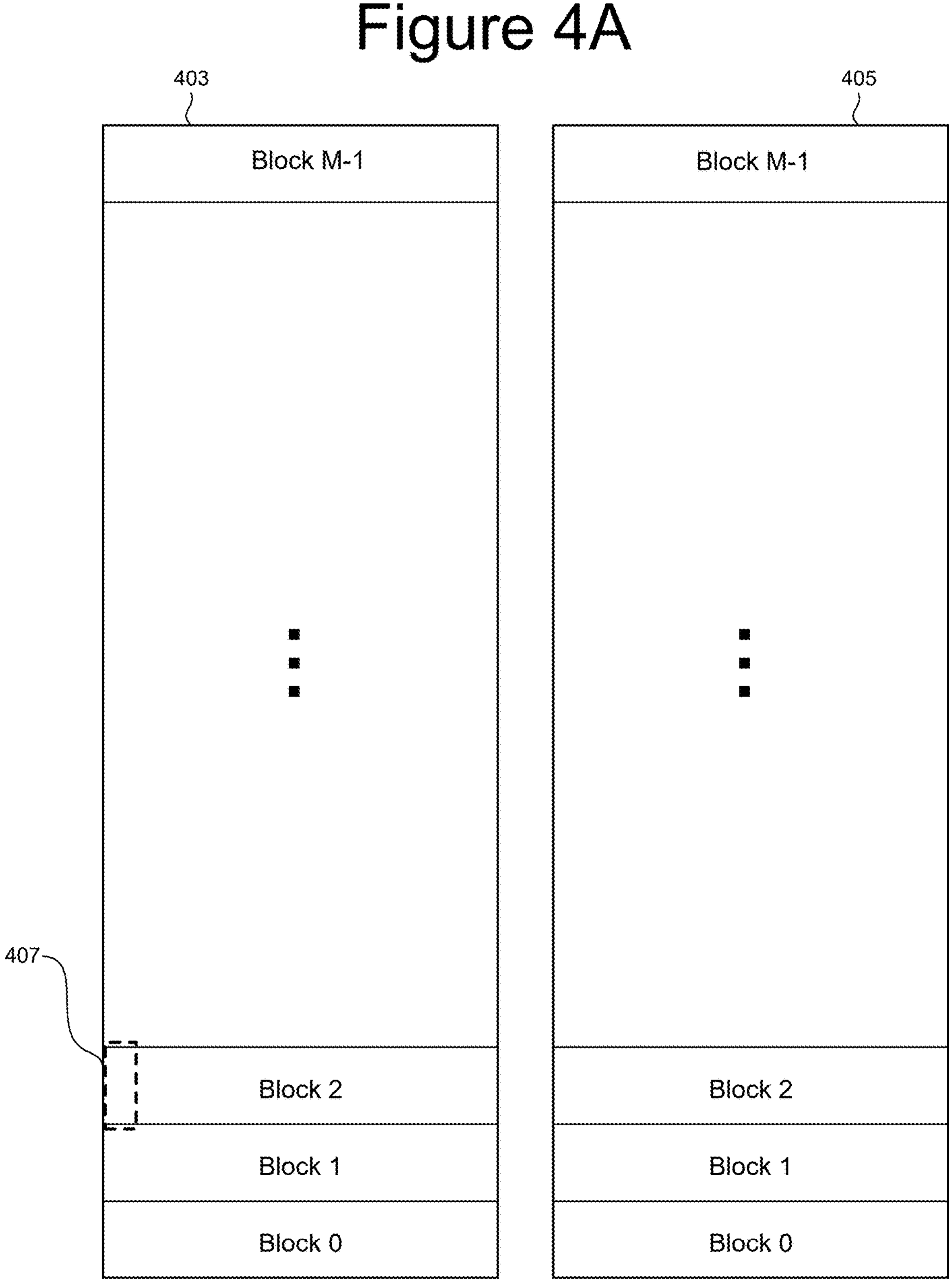
FIG. 4A is a block diagram of one embodiment of a memory structure having two planes.

FIG. 4A is a block diagram explaining one example organization of memory structure 202, which is divided into two planes 403 and 405. Each plane is then divided into M physical blocks. In one example, each plane has about 2000 physical blocks (or more briefly “blocks”). However, different numbers of blocks and planes can also be used. In one “full-block” embodiment, a block of memory cells is a unit of erase. That is, all memory cells of a block are erased together. In a “sub-block mode” embodiment, blocks are divided into sub-blocks and the sub-blocks are the unit of erase. In an embodiment, a block contains a number of word lines with each sub-block containing a unique set of the data word lines. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
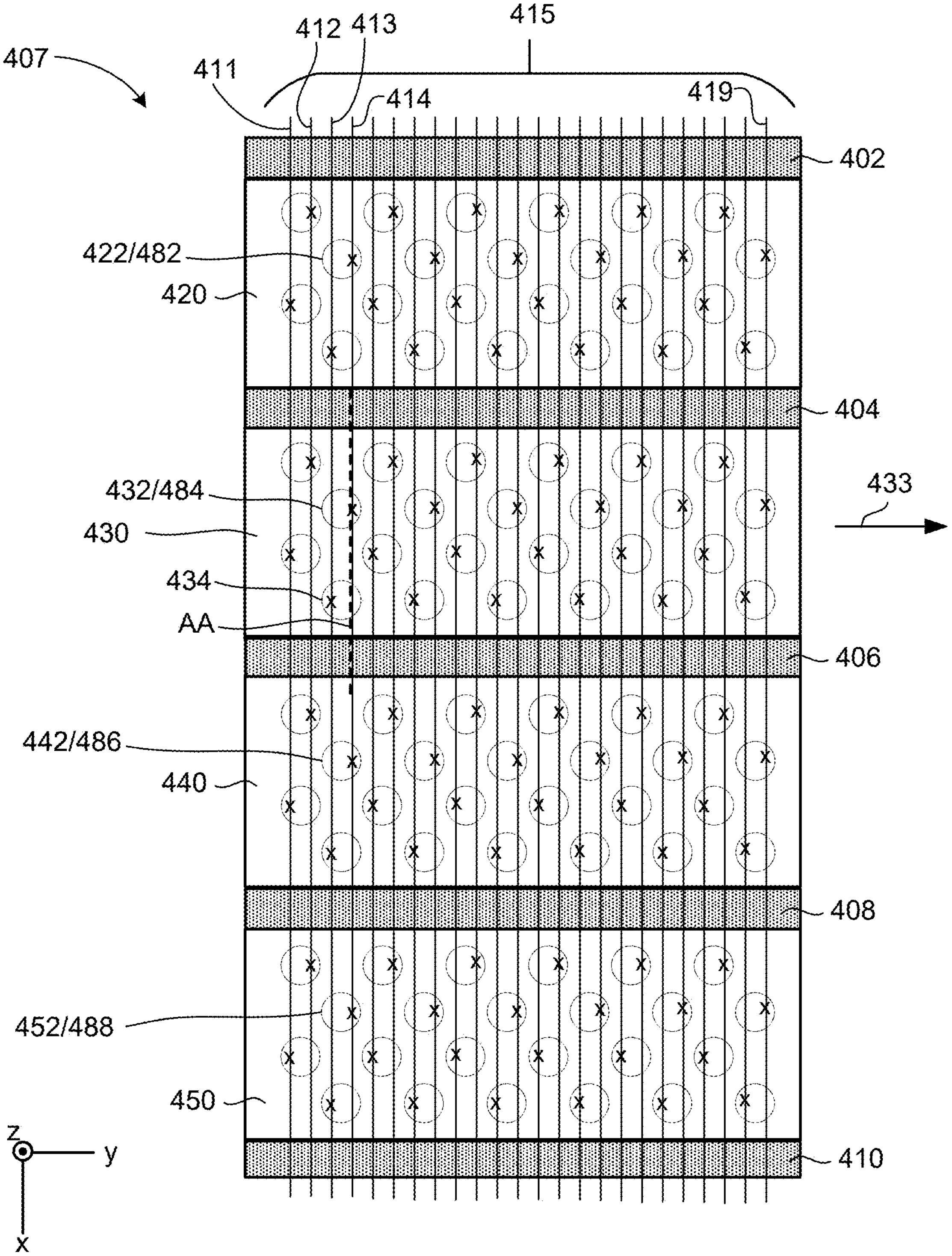
FIG. 4B is a block diagram depicting a top view of a portion of block of memory cells.

FIGS. 4B-4E depict an example three dimensional (“3D”) NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, and 452. Vertical column 422 implements NAND string 482. Vertical column 432 implements NAND string 484. Vertical column 442 implements NAND string 486. Vertical column 452 implements NAND string 488. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, and 410, which are formed of $SiO_2$; however, other dielectric materials can also be used. Isolation regions 402, 404, 406, 408, and 410 serve to divide the top layers of the physical block into four regions; for example, the top layer depicted in FIG. 4B is divided into regions 420, 430, 440, and 450, which are referred to herein as "sub-blocks. Each sub-block contains a large number of NAND strings. In one embodiment, isolation regions 402 and 410 separate the physical block 407 from adjacent physical blocks. Thus, isolation regions 402 and 410 may extend down to the substrate. In one embodiment, the isolation regions 404, 406, and 408 only divide the layers used to implement select gates so that NAND strings in different strings can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, and 450. In that implementation, each physical block has sixteen rows of active columns and each bit line connects to four NAND strings in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region (420, 430, 440, 450) having four rows of vertical columns, four regions (420, 430, 440, 450) and sixteen rows of vertical columns in a block, those exact numbers are an example implementation. Other embodiments may include more or fewer regions (420, 430, 440, 450) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
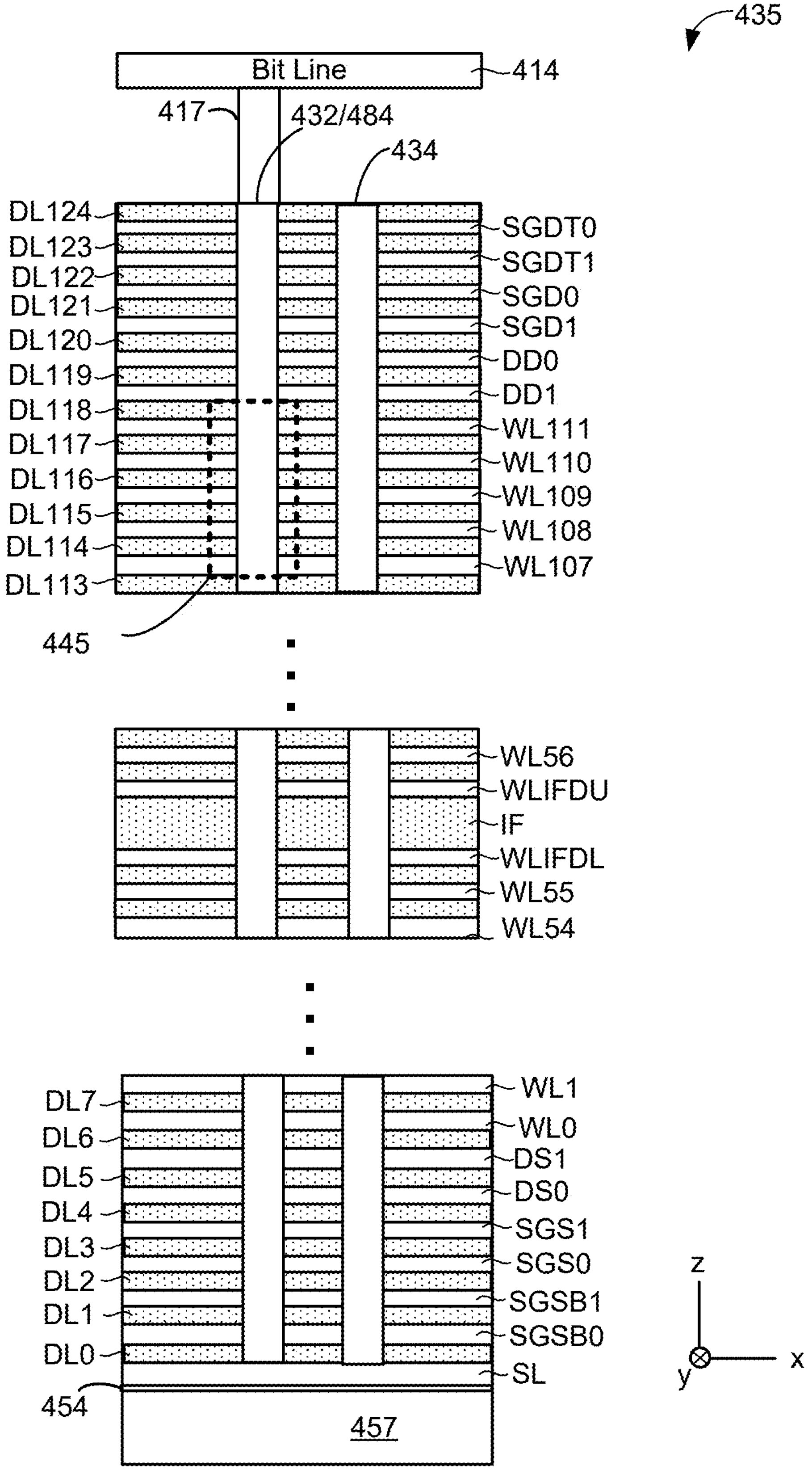
FIG. 4C depicts an embodiment of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0- DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have the same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two sub-blocks (SB). The two SB stack comprises SB0 and SB1. A two SB or other multi-SB stack can be used to form a relatively tall stack while maintaining a relatively narrow memory hole width (or diameter). After the layers of the lower SB are formed, memory hole portions are formed in the lower SB. Subsequently, after the layers of the upper SB are formed, memory hole portions are formed in the upper SB, aligned with the memory hole portions in the lower SB to form continuous memory holes from the bottom to the top of the stack. The resulting memory hole is narrower than would be the case if the hole were etched from the top to the bottom of the stack rather than in each SB individually. An interface (IF) region is created where the two SBs are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU).

Figure 4D:
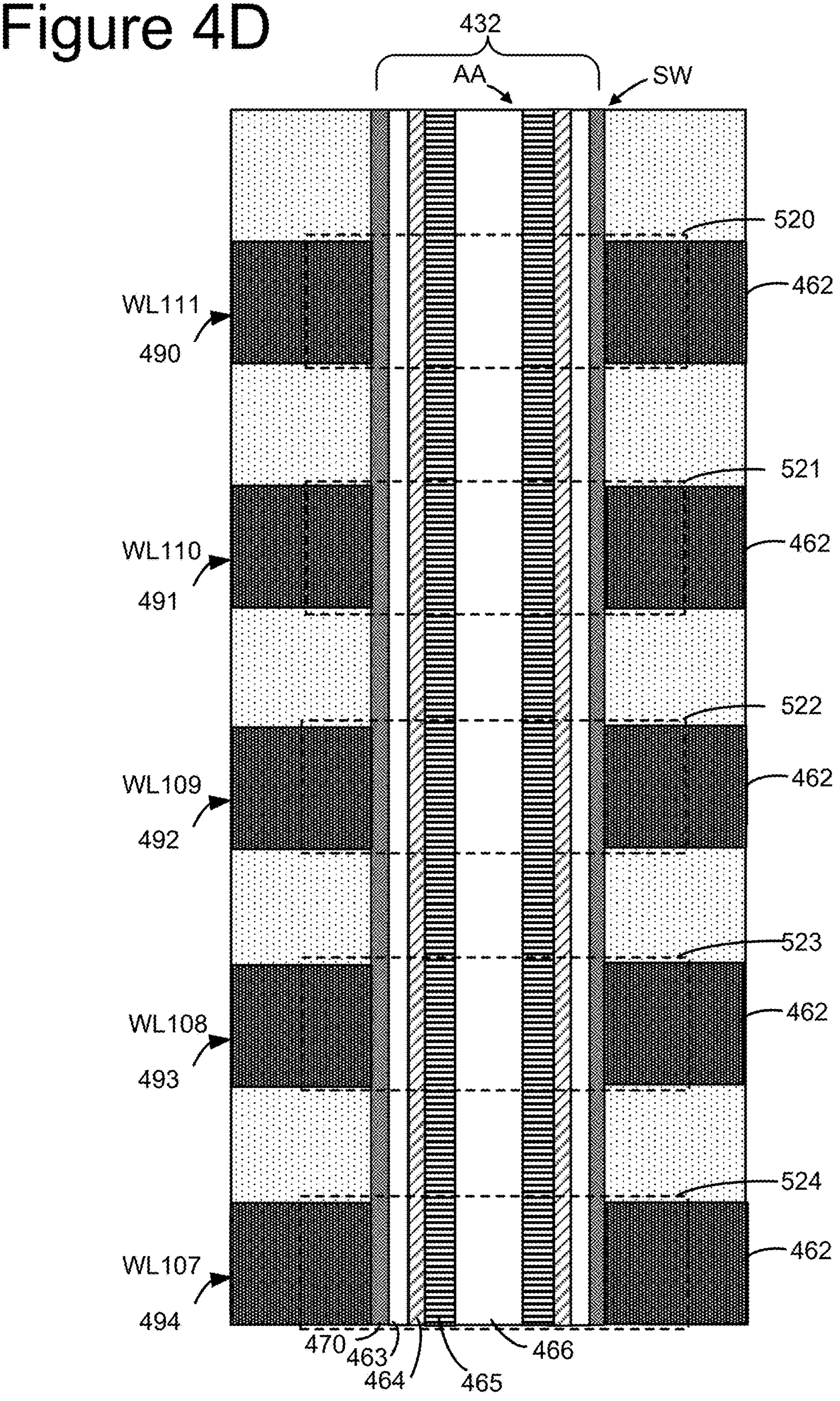
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
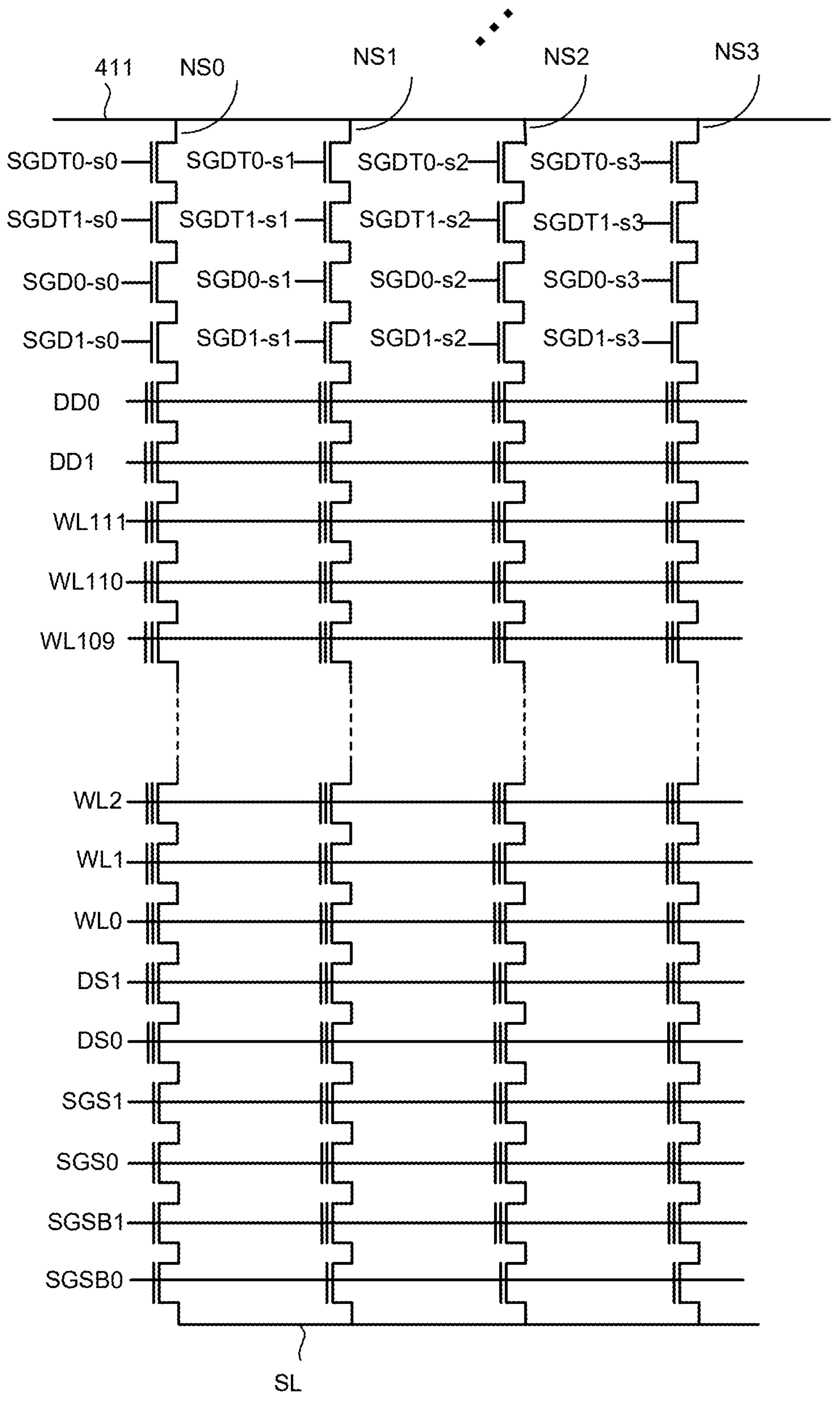
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to four NAND strings. Thus, FIG. 4E shows bit line 411 connected to NAND string NS0, NAND string NS1, NAND string NS2, and NAND String NS3.

In one embodiment, there are four sets of drain side select lines in the physical block. For example, the set of drain side select lines connected to NS0 include SGDT0-s0, SGDT1-s0, SGD0-s0, and SGD1-s0. The set of drain side select lines connected to NS1 include SGDT0-s1, SGDT1-s1, SGD0-s1, and SGD1-s1. The set of drain side select lines connected to NS2 include SGDT0-s2, SGDT1-s2, SGD0-s2, and SGD1-s2. The set of drain side select lines connected to NS3 include SGDT0-s3, SGDT1-s3, SGD0-s3, and SGD1-s3. Herein the term “SGD” may be used as a general term to refer to any one or more of the lines in a set of drain side select lines. In some embodiments, the same operating voltage is applied to SGDT0 and SGDT1. In some embodiments, the same operating voltage is applied to SGD0 and SGD1. In some erase embodiments, different operating voltage are applied to SGDT0/SGDT1 than to SGD0/SGD1. Note that SGDT0/SGDT1 are adjacent to the bit line. In some erase embodiments, a voltage applied to SGDT0/SGDT1 in combination with a bit line voltage may be used to generate a gate induced gate leakage (GIDL) current. Such a voltage applied to SGDT0/SGDT1 may be referred to herein as a GIDL voltage.

In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These four sets of drain side select lines correspond to four “sub-blocks.” A first sub-block corresponds to those vertical NAND strings controlled by SGDT0-s0, SGDT1-s0, SGD0-s0, and SGD1-s0. A second sub-block corresponds to those vertical NAND strings controlled by SGDT0-s1, SGDT1-s1, SGD0-s1, and SGD1-s1. A third sub-block corresponds to those vertical NAND strings controlled by SGDT0-s2, SGDT1-s2, SGD0-s2, and SGD1-s2. A fourth sub-block corresponds to those vertical NAND strings controlled by SGDT0-s3, SGDT1-s3 , SGD0-s3, and SGD1-s3. As noted, FIG. 4E only shows the NAND strings connected to bit line 411. However, a full schematic of the block would show every bit line and four vertical NAND strings connected to each bit line.

In one embodiment, all of the memory cells on the NAND strings in a physical block are erased as a unit. However in some embodiments, a physical block is operated as multiple tiers, with each tier containing a contiguous set of word lines. For example, memory cells connected to WL0 - WL55 may be in one tier and memory cells connected to WL56-WL111 may be in another tier. A physical block could be operated in more than two tiers. Erase units can be formed based on other divisions of physical blocks.

Although the example memories of FIGS. 4-4E are three dimensional memory structure that includes vertical NAND strings with charge-trapping material, other 3D memory structures can also be used with the technology described herein.

Figure 5A:
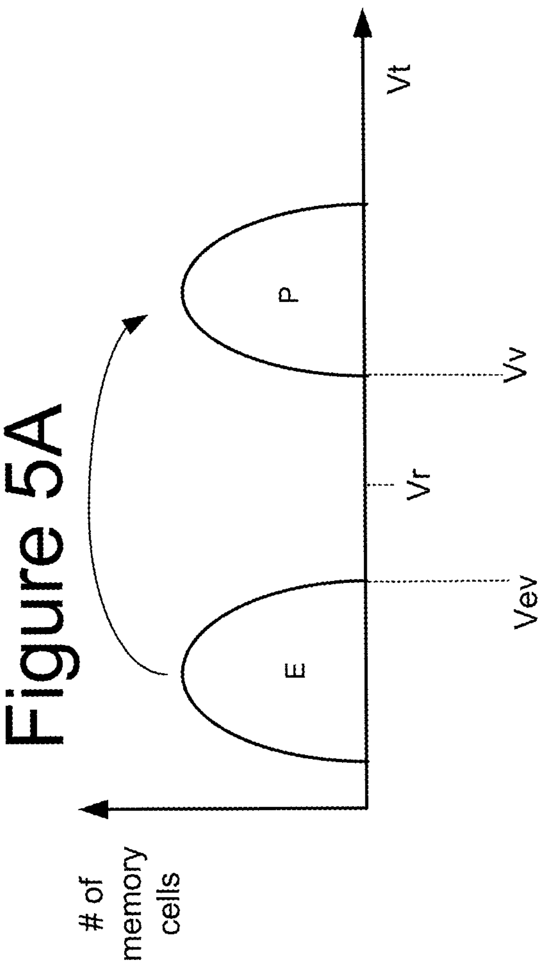
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells (“SLC”). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data “1” and programmed memory cells store data “0.” FIG. 5A depicts read reference voltage Vr. By testing (e.g., performing one or more sense operations) whether the threshold voltage of a given memory cell is above or below Vr, the system can determine whether a memory cells is erased (state E) or programmed (state P). FIG. 5A also depicts program verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells (“MLC”). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
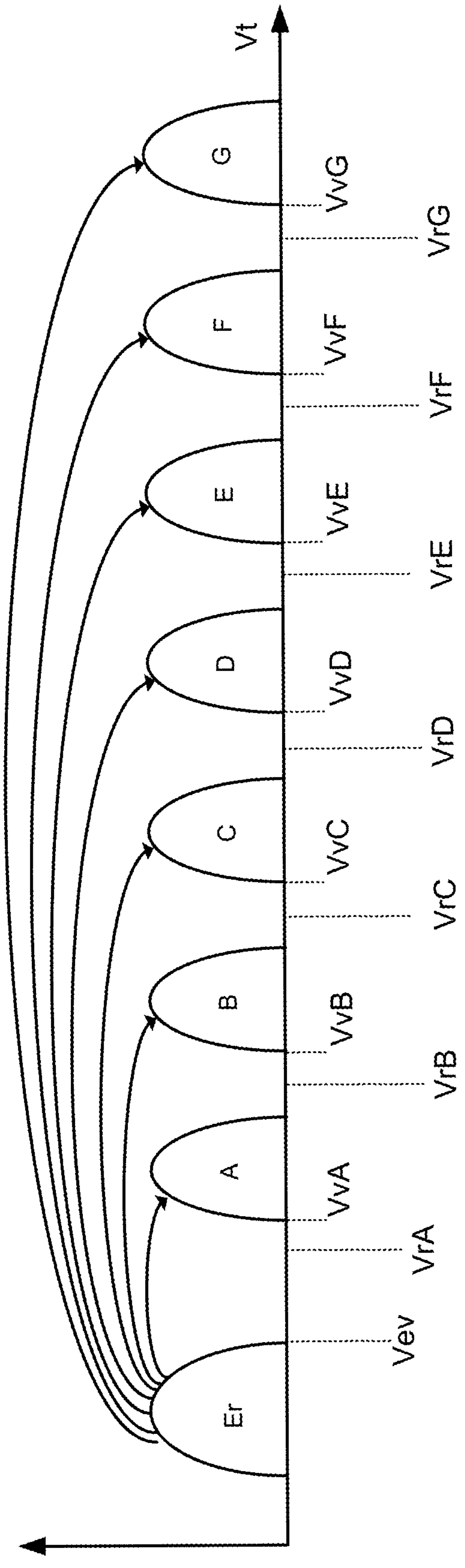

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 6:
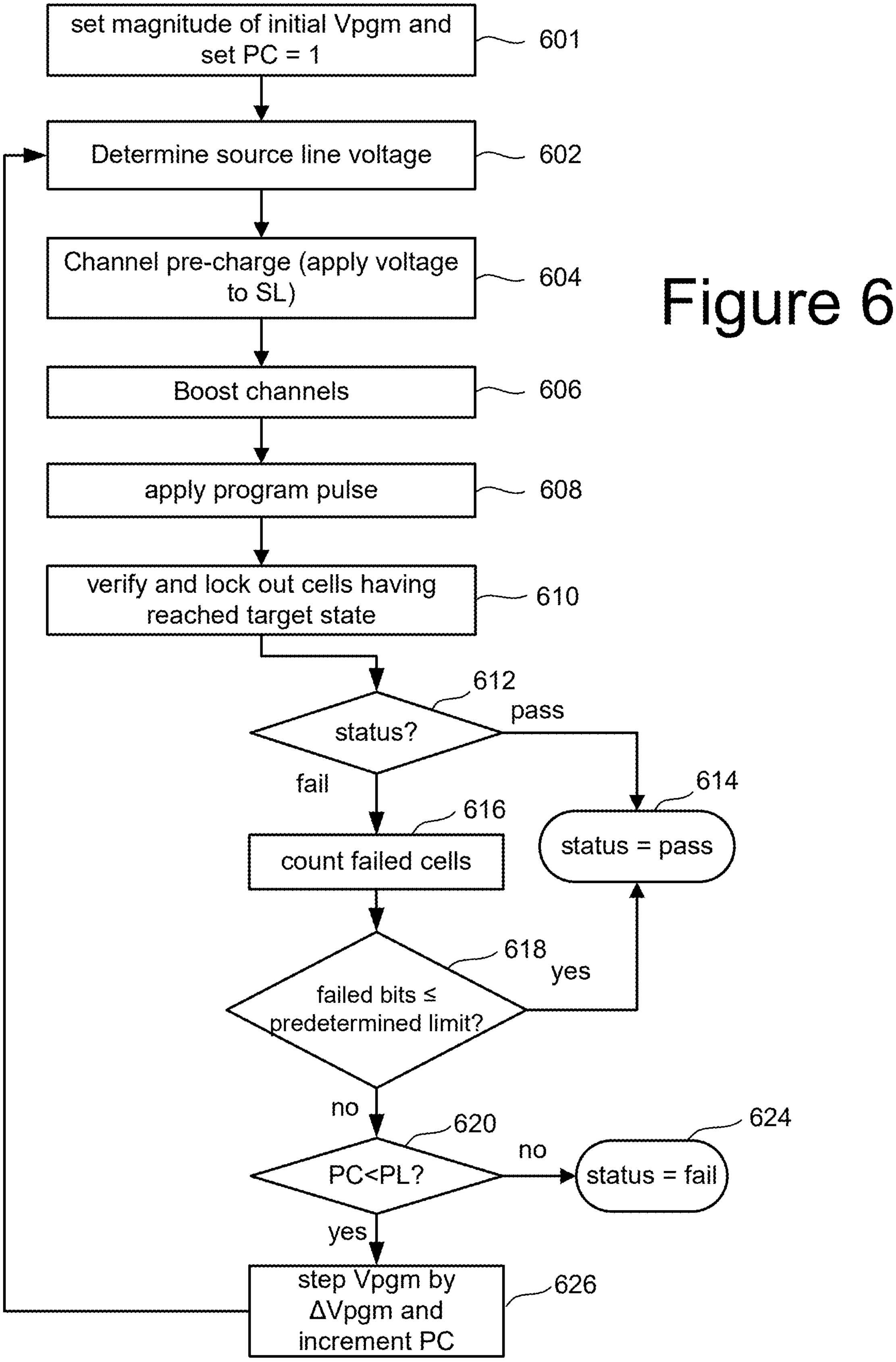
FIG. 6 is a flowchart describing one embodiment of a process for programming memory cells connected to a selected word line.

FIG. 6 is a flowchart describing one embodiment of a process for programming memory cells connected to a selected word line. Programming memory cells connected to a word line is referred to herein as programming the word line. For purposes of this document, the term program and programming are synonymous with write and writing. The process includes multiple loops, each of which includes a program phase and a verify phase. Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 601 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. Step 602 includes determining a source line voltage. The magnitude of the source line voltage may depend on what region (e.g., WL) of the block is being programmed, the magnitude of the program voltage, and/or whether the memory system has detected evidence of a plane or die level defect such that a different magnitude source line voltage should be used. The magnitude of the source line voltage may impact the pre-charging of NAND channels of unselected NAND strings. To assist in the boosting, in step 604 the system will pre-charge channels of NAND strings that include memory cells connected to the selected word line that are to be inhibited from programming. Step 604 may include applying the voltage to the source line while turning on source side select transistors to pass the source line voltage to channels of NAND strings. With reference to the schematic in FIG. 4E, a suitable voltage is applied to SGS1, SGS0, SGSB1 and SGSB0 to turn on the source side select transistors.

In step 606, NAND strings that include memory cells connected to the selected word line that are to be inhibited from programming have their channels boosted to inhibit programming. Such NAND strings are referred to herein as "unselected NAND strings." In one embodiment, at least some unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage. In one embodiment, one or more data latches in the managing circuit 330 are used to indicate whether a memory cell is locked out or is to receive full programming.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

Figure 7:
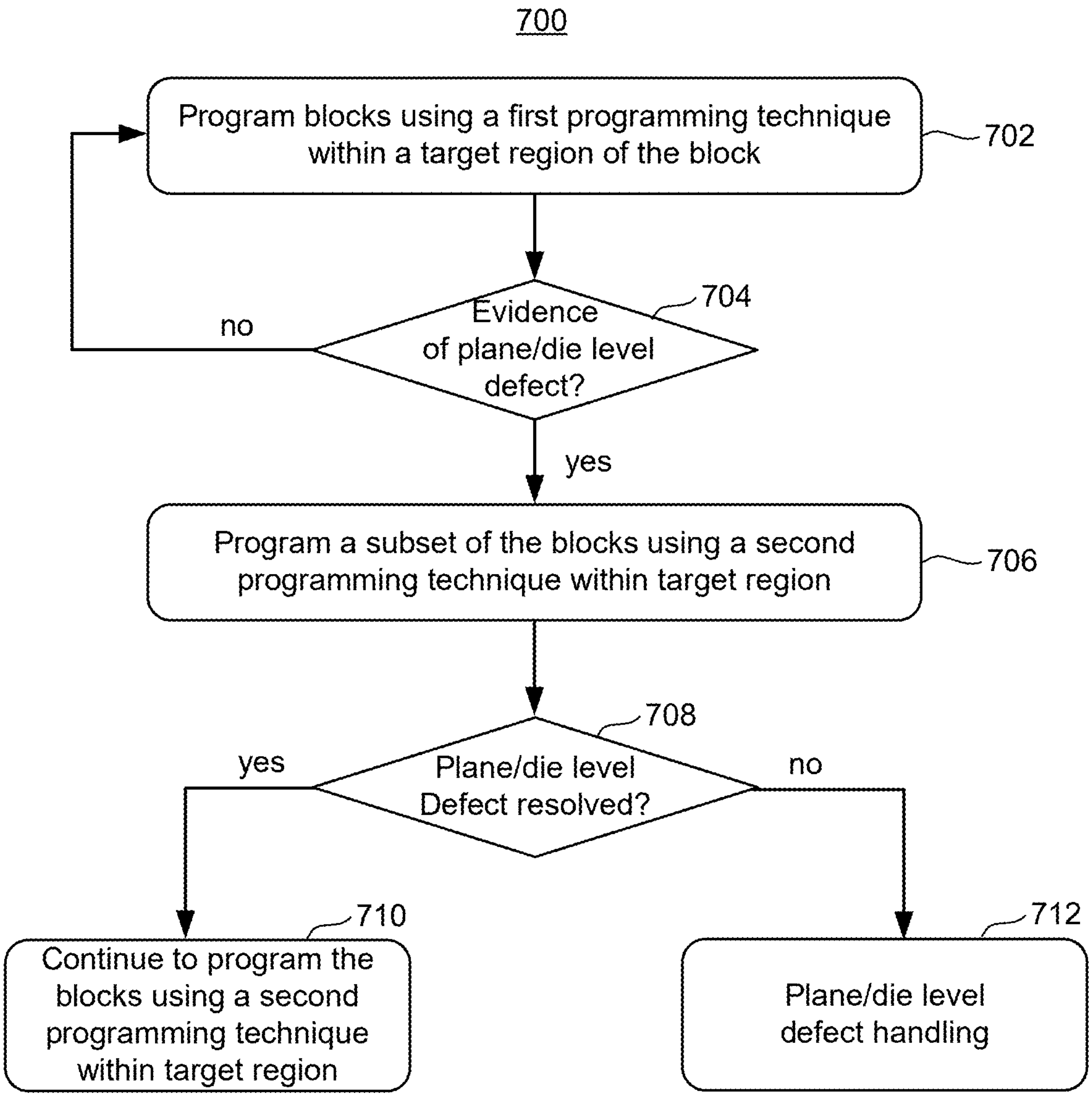
FIG. 7 is a flowchart of one embodiment of a process of recovering blocks that are candidates for retirement.

FIG. 7 is a flowchart of one embodiment of a process 700 of changing a programming technique in response to evidence of a plane or die level defect. The process 700 may be performed by one or more control circuits (e.g., one or more of memory controller 120, system control logic 260, row control circuitry 220, and/or column control circuitry 210. Process 700 may be used to operate NAND memory cells in a NAND memory architecture such as, but not limited to, those depicted in FIGS. 4-4E. Step 702 includes programming blocks using a first programming technique within a target region of the blocks. The target region of the blocks may be certain word lines in the block. In one embodiment, the target region is a set of word lines adjacent to the source line. In FIG. 4C the set of word lines adjacent to the source line begin with WL0. The set of word lines adjacent to the source line could include a contiguous set of word lines (e.g., WL0 - WL20). However, the set could include more or fewer than 21 word lines. The first programming technique may include applying a certain voltage to the source line when programming memory cells connected to one of the word lines in the target region. In some embodiments, this certain voltage is a higher than nominal voltage and is only applied on the higher numbered program loops. In other words, in an embodiment this higher than nominal voltage is only applied when the program voltage is above a threshold.

Between steps 702 and 704 the blocks could be read one or more times. Also, the blocks could be erased. Step 704 is a determination of whether there is evidence of a plane or die level defect. The memory system may further determine whether the possible plane or die level defect might be impacting memory operations in the target region. In one embodiment, the memory system determines whether a threshold number of blocks have exhibited failures of memory operations in the target region, which may be evidence of a plane or die level defect. The plane or die level defect may be a defect that is outside of the blocks of memory cells, in which case the defect may impact any or all of the blocks in a plane or die. The defect may impact delivery of a voltage or other signal to the blocks of memory cells. For example, the defect may impact delivery of a voltage to the source line, one or more word lines, SGD line, SGS line, bit lines, etc.

Step 704 may include determining whether blocks are candidates to retire. A block may be a candidate to retire due to failing to meet a reliability criterion with respect to program, read, and/or erase operations in the block. The reliability criterion is used to determine whether the block may continue to reliably program and read data. For example, the block may be a fail to meet a reliability criterion due to read failures within the block. An example read failure is a failure to decode an ECC codeword with an ECC decoder. The reliability criterion may permit some failures to decode ECC codewords within the block. Another example of a reliability criterion is a post program read test that reads ECC codewords just after programming. Another way to express the decision in step 704 is whether a block meets a failure criterion. A failure criterion may include, but is not limited to, the failure to decode a certain number of ECC codewords in a block. Even though some block are candidates to retire this does not necessarily indicate evidence of a plane or die level defect that is impacting memory operations in the target region. Thus, the memory system may identify a subset of the candidate blocks that are exhibited failures in the target region. For example, the failure could be a failure to decode data that was programmed within the target region.

Step 706 includes programming a subset of the blocks using a second programming technique within the target region. The second programming technique may include applying a lower voltage to the source line than was used in the first programming technique. In an embodiment, this lower source line voltage is used in all program loops. In an embodiment, for the second programming technique the memory system selects a different source for providing a voltage to a control line in the memory structure. For example, the memory system may select a different voltage generator to provide a voltage to a particular control line for the second programming technique than was used in the first programming technique (for at least some program loops when programming the target region). Step 706 may be used to attempt to recover a block that is a candidate for retirement. Here, "recovering the block" means to continue to program data in the block even though the block was a candidate for retirement. The storage system may wait until a certain number of blocks meet the condition for attempting to recover the block prior to attempting recovery. For example, the recovery may be attempted in response to detecting evidence of the plane/die level defect.

Step 708 includes a determination of whether the plane/die level defect has been resolved. Step 708 may include determining whether the memory operations performed within the blocks pass after programming with the second programming technique. These memory operations may include the programming, read, and/or erase. If the plane/die level defect has been resolved then storage system may continue to use the second programming technique when programming within the target region (step 710). Note that the second programming technique may be used for all blocks in the plane or die such that the plane/die level defect is overcome.

If the plane/die level defect has not been resolved then plane/die level detect handling is performed in step 712. Step 712 may include determining whether there are a sufficient number of good blocks to continue to use the plane or die. If not, one option is to move data out of the plane or die. Another option is to enter a read-only mode.

In some embodiments, the magnitude of the voltage applied to the source line during programming depends on the location of the selected word line, the magnitude of the program voltage and whether the block has been identified as a candidate for retirement. FIG. 8 shows how the magnitude of the source line voltage correlates with these factors. The x-axis is program voltage magnitude. The y-axis is word line location. The diagram is divided into four regions. The lower word lines (closer to source line) may be more vulnerable to program disturb, especially when the program voltage is larger. Using a larger source line voltage can result in better pre-charge of the NAND channels to thereby reduce program disturb. However, using a larger source line voltage will typically consume more power than using the smaller source line voltage. For the region with lower WLs and smaller program voltages a smaller source line voltage is used. For the region with higher WLs and smaller program voltages the smaller source line voltage is used. For the region with higher WLs and larger program voltages the smaller source line voltage is used. For the region with lower WLs and larger program voltages either the smaller source line voltage or the larger source line voltage might be used, depending on the status of the block. If less than a threshold number of blocks in plane or die exhibit problems in the target region, the larger source line voltage may be used. Using the larger source line voltage when the larger program voltages are used can improve programming by, for example, providing for a better pre-charge of channels of unselected NAND strings to thereby reduce program disturb. However, if a large number of blocks are exhibiting failures of memory operations in the target region, the smaller source line voltage may be used. Using the smaller source line voltage has a possibility of improving programming. One possible reason for the improvement in programming is that there may be a defect that has arisen such that the smaller voltage is delivered to the source line more effectively than the larger voltage. In some embodiments, the voltage source that provides the smaller voltage has a better DC driving capability than the voltage source that provides the larger voltage. However, other factors may impact the voltage delivery.

FIG. 9 is a flowchart of one embodiment of a process of programming memory cells. The process may be used for programming NAND memory such as, but not limited to, the NAND memory depicted in FIGS. 4-4E. The process is based on the source line voltages depicted in FIG. 8. The process describes one loop of a programming process. As noted in the programming process of FIG. 6, the program voltage may be stepped up each program loop. Step 902 includes a determination of whether the selected word line is in the target region. In the example in FIG. 8, the target region is the lower word lines (e.g., the word lines closer to the source line). If the selected word line is not in the target region then the lower source line voltage is used when programming in step 904. If the selected word line is in the target region then step 906 includes a determination of whether the program voltage is greater than or equal to a threshold voltage. The threshold voltage here refers to a program voltage magnitude for which it has been determined (online or offline) there is a benefit for using the larger source line voltage. If the program voltage is below the threshold voltage then in step 904 the lower source line voltage is used when programming. If the program voltage is at or above the threshold voltage then in step 908 a determination is made whether to use the lower or higher source line voltage. In an embodiment, the higher source line voltage will be used provided that the memory system has not defected evidence of a plane or die level defect that may be impacting memory operations in the target region. For example, the higher source line voltage may be used if the storage system has not identified a number of blocks having failures in the target region. In an embodiment, the lower source line voltage may be used in response to a number of blocks having failures in the target region as an attempt to recover the blocks. Moreover, the lower source line voltage may be used to reduce program disturb in any of the blocks in the plane or die. Note that the storage system will not necessarily always use the lower source line voltage when there is a block level failure. The determination of whether the use the lower source line voltage may be based on what regions (e.g., word lines) had faults that led to the block level failures. After the determination in step 908 the word line is programmed as in step 904 or 910 depending on the source line voltage. Also note that once a block has been recovered by the use of the lower source line voltage (step 904), going forward the storage system may continue to use the lower source line voltage.

Figure 10:
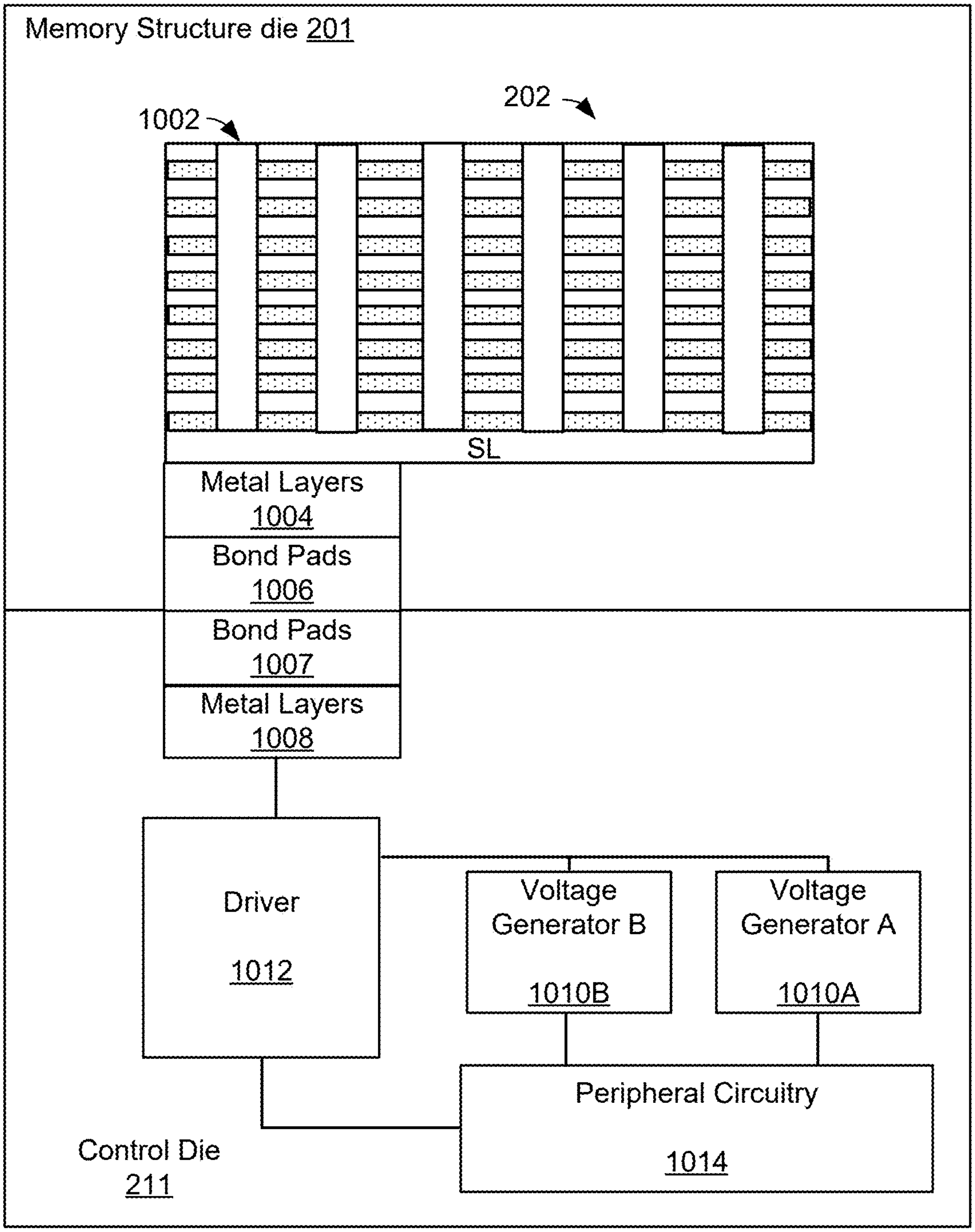
FIG. 10 is a block level diagram that shows elements in a control die attached to a memory structure die.

As noted above, there may be differences in the circuitry that provides the smaller source line voltage and the larger source line voltage. FIG. 10 is a block level diagram that shows elements in a control die 211 attached to a memory structure die 201. The memory structure die 201 has a memory structure 202, which contains NAND strings 1002 extending through alternative conductive and insulating layers. The control die 211 and memory structure die 201 are bonded together with a first set of bond pads 1006 on the memory structure die 201 and a second set of bond pads 1007 on the control die. The control die 211 has a first voltage generator (Voltage Generator A) 1010A and a second voltage generator (Voltage Generator B) 1010B. Voltage Generator A 1010A is configured to provide the smaller source line voltage and Voltage Generator B 1010B is configured to provide the larger source line voltage. Each Voltage Generator 1010A, 1010B is connected to the driver 1012 such that one of the voltages may be provided to the source line (SL) on the memory structure die 201. The peripheral circuitry 1014 controls the Voltage Generators 1010A, 1010B and the driver 1012. The voltage from the driver 1012 may travel through metal layers 1008 on the control die 211, the bond pads 1007, 1006, and metal layers 1004 on the memory structure die 201. Note that Voltage Generator B 1010B is not a mere replica or redundant version of Voltage Generator A 1010A. Also, note that in some cases both voltage generators 1010A, 1010B are used for a single program operation with Voltage Generator B 1010B being used to reduce program disturb during a portion of the programming operation such as when larger program voltages are applied.

Assuming that there are no defects, the voltage from either Voltage Generator 1010A, 1010B may be provided to the source line without problems. However, a defect may be present or develop over time that inhibits the delivery of the voltage from one of the Voltage Generator 1010A, 1010B. This defect could occur within the driver 1012, within one of the Voltage Generators 1010A, 1010B or occur somewhere along the pathway to the source line. One possible defect is a short along the pathway to ground (Vss). For example, the driver 1012 could short to ground. In an embodiment the drive strength of the two Voltage Generators 1010A, 1010B are not the same. In an embodiment Voltage Generator A 1010A (providing the lower voltage) has a greater drive strength than Voltage Generator B 1010B (providing the higher voltage). A defect such as a short may prevent Voltage Generator B 1010B from adequately providing the higher voltage to the source line when Voltage Generator A 1010A is still able to provide the lower voltage to the source line. The inability of Voltage Generator B 1010B from adequately providing the higher voltage to the source line may result in a weaker channel pre-charge during programming, thereby resulting in greater program disturb. However, switching to the Voltage Generator A 1010A (providing the lower voltage) still provides for adequate pre-charge during programming, thereby resulting in less program disturb than if Voltage Generator B 1010B had been used under these conditions. Note that continuing to use Voltage Generator B 1010B under these defect conditions could result in a die level failure. However, switching over to Voltage Generator A 1010A can allow for block recovery as described above and also prevent die level failure. Although defects are described with respect to the two dies 211, 201 similar issues and defects may occur in a single die architecture (see memory die 200 in FIG. 2A).

Figure 11:
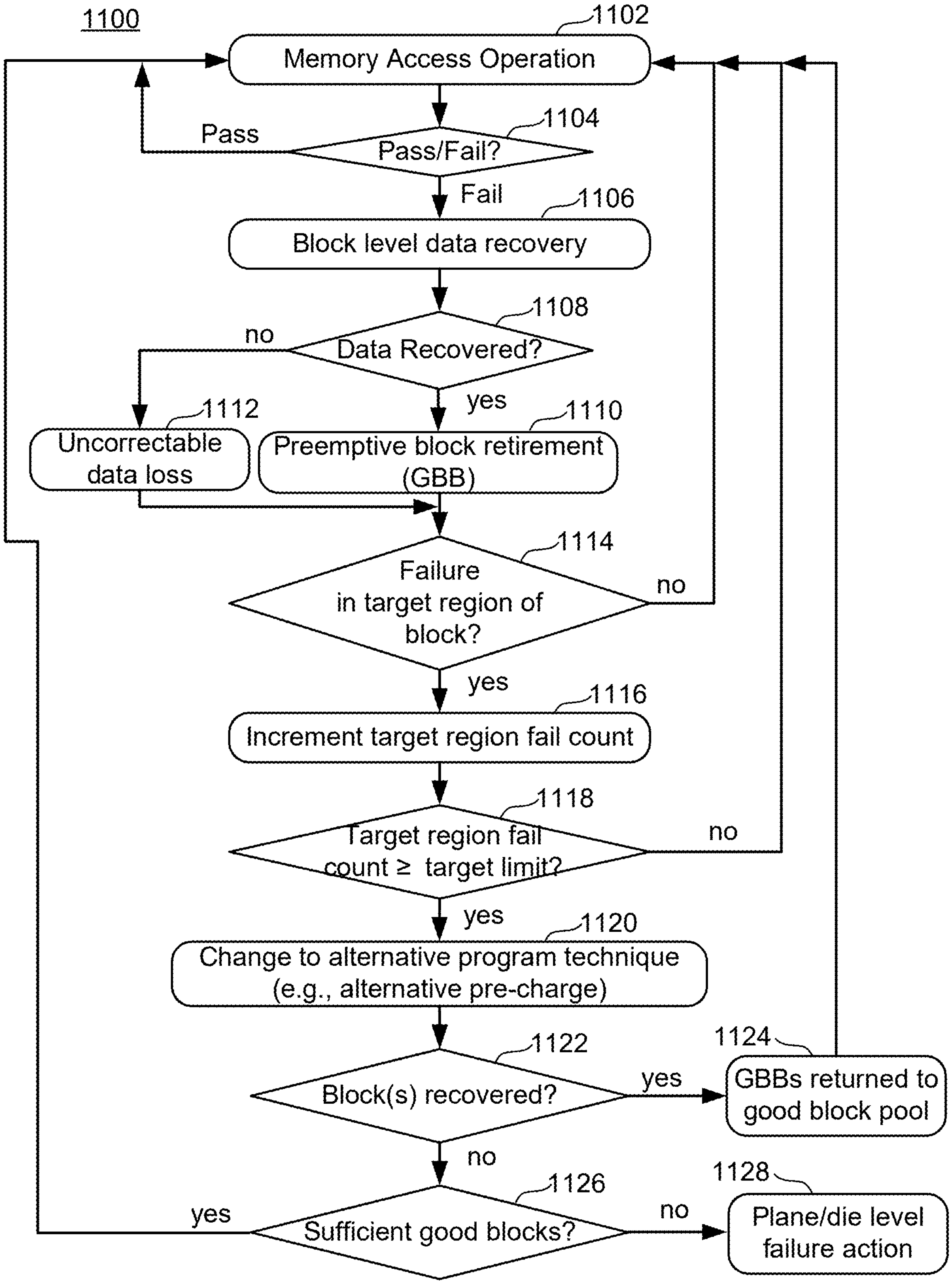
FIG. 11 is a flowchart of one embodiment of a process of recovering blocks that are candidates for retirement with block level recovery.

FIG. 11 is a flowchart of one embodiment of a process 1100 of recovering blocks that are candidates for retirement with block level recovery. Process 1100 provides further details of one embodiment of process 700. The process 1100 may be performed by one or more control circuits (e.g., one or more of memory controller 120, system control logic 260, row control circuitry 220, and/or column control circuitry 210. Process 1100 may be used to operate NAND memory cells in a NAND memory architecture such as, but not limited to, those depicted in FIGS. 4-4E.

Step 1102 includes performing a memory access operation. The memory access operation may include, for example, program, read or erase. If the memory operation is a program operation, then a first program technique is used in the target region. The first program technique may include applying a higher source line voltage for higher program voltages when programming in the target region. The first program technique may include applying a higher than nominal pre-charge for NAND channels for higher program voltages when programming in the target region. The higher than nominal pre-charge and higher source line voltage are relative to a nominal pre-charge and a lower source line voltage that may be used outside the target region (as well as for lower program voltage within region). If the memory operation is a read then for purpose of discussion the first program technique was used in the target region. If the memory operation is an erase then for purpose of discussion the first program technique was used in the target region.

Step 1104 includes a determination of whether the memory access operation passed or failed. This determination may be made on a page by page basis. For a read operation, the failure may be failure to successfully decode an ECC codeword. For a program operation the failure may be connected to checking the data integrity immediately after the program operation. The storage system may read the data immediately after the program operation to confirm that the data was programmed correctly. Thus, in step 1104 the storage system may determine whether any of the pages that were programmed or read had a failure. If the memory access operation passed then another memory access operation may be performed (step 1102). If the memory access operation failed (e.g., at least one page had a failure) then block level data recovery is performed in step 1106. Examples of block level data recovery include, but are not limited to, dynamically adjusting read reference levels and/or block level XOR recovery. Step 1108 includes a branch depending on whether or not the data was recovered. If the data was recovered then pre-emptive block retirement may be performed in step 1110. Pre-emptive block retirement may place the block into a grown bad block (GBB) pool. In an embodiment, only those blocks that fail to meet a reliability criterion are placed into the GBB pool. The reliability criterion may include, for example, a certain number of failures to decode ECC codewords in the block. As will be explained below the block may be removed from the GBB depending on the test in step 1122. An alternative way to describe step 1110 is the that block is identified as a candidate to retire, pending the attempt to recover the block with the new programming technique in step 1120. The block may be referred to as only a candidate to retire at this stage due to the possible recovery of the block later in process 1100. If the data was not recovered in step 1106 (step 1108 is no) then an uncorrectable data loss has occurred (step 1112). Step 1112 may also include placing the block into the GBB pool or identifying the block as a candidate to retire.

After either step 1110 or 1112 the process continues at step 1114, which includes a determination of whether there is a failure in the target region of the block. For example, the storage system determines whether there was a failure to program a page or read a page within the target region of the block. It is possible that the block can be recovered if the manner in which the block is programmed in the target region is changed. However, if the storage system determines that there is not a significant failure in the target region then the storage system does not attempt to recover the block. Note that the lack of the failure in the target region may be interpreted as a lack of evidence of a plane/die level defect impacting memory operations in the target region. Thus, the blocks stays in the GBB pool (or alternatively moves from a candidate to retire to actually being retired). The process then returns to step 1102 for another memory access operation in a different block.

If, however, there is a failure within the target region then in step 1116 the storage system increments a fail count. The fail count is a count of such blocks that have exhibited failure within the target region. A sufficiently high number of blocks exhibiting failure within the target region may be evidence of a plane or die level defect. Step 1118 includes a determination of whether the target region fail count is greater or equal to a target limit. The target limit could be set at any desired limit (e.g., 10 blocks, 20 blocks, etc.). The target limit may be as low as one block or higher than 20 blocks. The target limit may be set at a value that suggests that a plane or die level failure may be occurring. For example, a defect with the driver 1012 (see FIG. 10) may impact all blocks in a plane or die. Therefore, the target limit may be set to catch such a plane or die level failure prior to too many blocks being impacted. If the target count is not met, then the block remains on the GBB list. However, note that this block could later be recovered with the steps described below.

If the target count is met, then in step 1120 the storage system changes to an alternative programming technique. For example, an alternative program pre-charge technique is used. The alternative program pre-charge technique may be to use the nominal pre-charge throughout the block and for all program voltages (as opposed to using the higher than nominal pre-charge for the target region when using higher program voltages. The pre-charge technique may correlate to the source line voltage, wherein the higher pre-charge is achieved with a larger source line voltage and the lower pre-charge is achieved with a lower source line voltage. In some embodiments, Voltage Generator A 1110A is used for the nominal pre-charge (smaller source line voltage) and Voltage Generator B 1110B is used for the greater than nominal pre-charge (larger source line voltage). In an embodiment, this alternative program pre-charge technique is applied to all blocks in the plane or die since there may be a defect (e.g., short) that could impact all blocks in the plane or die. Step 1120 may include applying the alternative program technique (e.g., alternative pre-charge technique) to any block that has previously been identified as a candidate for recovery. For example, any block on the GBB list that also had a failure in the target region (see step 1114) could be tested with the alternative program technique.

Step 1122 includes a test of whether the block(s) has been recovered after using the alternative program pre-charge technique. This test may perform program, read, and/or erase operations and determine whether such operations pass or fail. Step 1122 may be performed for all blocks subjected to the alternative program pre-charge technique. Step 1124 includes moving all blocks that were recovered from the GBB list to a good block pool. Also, step 1124 may be stated to be a recovery of a plane or die level failure. Moreover, the recovery of the blocks when using the second programming technique provides evidence that the second programming technique may be useful for other blocks in the plane or die. Therefore, the second programming technique may now be used for all good block sin the plane or die.

It is possible that a block is not recovered despite the alternative program pre-charge technique (step 1122 is no). In this case, such blocks remain on the GBB list. Step 1126 is a determination of whether there are sufficient good blocks. If not then in step 1128 plane or die level failure action is taken. For example, readable data from the die could be moved to another die. Another option is to use the die in a read-only mode. If there are sufficient good blocks then the process returns to step 1102 to perform another memory access operation in a good block.

FIG. 12 is a flowchart of one embodiment of a process 1200 of recovering blocks that are candidates for retirement with die level recovery. Many of the steps in process 1200 are similar to corresponding steps in process 1100 and therefore will not be described in detail. Step 1202 includes performing a memory access operation. Step 1204 includes a determination of whether the memory access operation pass or failed (e.g., any failed pages). Step 1206 include block level data recovery (e.g., dynamic read levels, block level XOR). Step 1210 includes pre-emptive block retirement in which may include adding the block to a GBB list. Step 1214 includes a determination of whether there is a failure in the target region of the block. For example, step 1214 includes a determination of whether a page could not be read or written in one of the word lines near the source line. Step 1216 increments the target region fail count, which may a count of blocks having failures in the target region. Step 1218 includes a determination of whether the target region fail count exceeds a target limit. This target limit may be similar to the target limit discussed in step 1128 (see FIG. 11). Step 1220 includes a change to an alternative programming technique, which may be similar to step 1120 (see FIG. 11). Step 1222 is a determination of whether the block was recovered as a result of using the alternative programming technique. Step 1224 includes moving the block from the GBB list to a good block list responsive to the block being recovered. Also, step 1224 may be stated to be a recovery of a plane or die level failure. Step 1226 includes a test of whether the GBB count is greater than a preemptive die retirement (PDR) limit. If the GBB count is not greater than the PDR limit then the process returns to step 1202 for another memory access operation. If, however, the GBB count is greater than the PDR limit the preemptive die retirement is performed in step 1228. Step 1230 may include die level (or plane level) data recovery (e.g., XOR, RAID, etc.). Data that is recovered from the failing plane/die may then be moved to another plane/die. The plane or die may then be retired from further use.

In view of the foregoing, an embodiment includes an apparatus comprising one or more control circuits configured to connect to a three-dimensional memory structure. the memory structure has blocks of memory cells in a plane on a die. The blocks are associated with a source line. The one or more control circuits are configured to program a target region within the blocks in the plane with a first programming technique. The one or more control circuits are configured to program the target region within at least a subset of the blocks in the plane with a second programming technique responsive to detecting evidence of a plane or die level failure that results in memory operation failures in the target region of the blocks.

In a further embodiment of the apparatus the one or more control circuits are further configured to determine that there is evidence of the plane or the die level failure responsive to a threshold number of the blocks failing to meet a reliability criterion with respect to the memory operation failures within the target region.

In a further embodiment of the apparatus the one or more control circuits are further configured to select first circuitry for providing a first voltage to a control line in the blocks for the first programming technique and select second circuitry for providing a second voltage to the control line in the blocks for the second programming technique.

In a further embodiment of the apparatus the one or more control circuits are further configured to test the subset of the blocks for a reliability criterion after programming the target region within the subset of the blocks with the second programming technique. And the one or more control circuits are further configured to continue to use the second programming technique in the target region for blocks in the subset that passed the reliability criterion.

In a further embodiment of the apparatus the one or more control circuits are further configured to program the target region within all good blocks in the plane with the second programming technique responsive to use of the second programming technique within the target region overcoming the plane or die level failure.

In a further embodiment of the apparatus the first program technique includes applying a first voltage to the source line for a set of program voltages and the second program technique includes applying a second voltage to the source line for the set of program voltages. The second voltage is less than the first voltage.

In a further embodiment of the apparatus the one or more control circuits further comprise a first voltage generator configured to output the first voltage. The first voltage generator has a first DC drive strength. The one or more control circuits further comprise a second voltage generator configured to output the second voltage. The second voltage generator has a second DC drive strength that is greater than the first DC drive strength. The one or more control circuits are further configured to select the first voltage generator prior to the evidence of the plane or the die level failure and to select the second voltage generator responsive to the evidence of the plane or the die level failure.

In a further embodiment of the apparatus the first program technique includes applying a first pre-charge voltage to NAND channels in the blocks and the second program technique includes applying a second pre-charge voltage to NAND channels in the blocks The second pre-charge voltage is less than the first pre-charge voltage.

In a further embodiment of the apparatus the one or more control circuits further comprises a first voltage generator configured to provide a first electron pre-charge to the NAND channels in the blocks in the plane. The first voltage generator has a first DC drive strength. The one or more control circuits further comprises a second voltage generator configured provide a second electron pre-charge to the NAND channels in the blocks in the plane that is less than the first electron pre-charge. The second voltage generator has a second DC drive strength that is greater than the first DC drive strength. The one or more control circuits are configured to use the first voltage generator to provide the first electron pre-charge and to use the second voltage generator to provide the second electron pre-charge.

In a further embodiment of the apparatus the target region of the blocks comprises a set of word lines adjacent to the source line.

An embodiment includes a method for operating NAND memory. The method comprises applying a voltage to a source line in the NAND memory while programming a set of word lines in blocks in a plane of the NAND memory. The method comprises identifying blocks having a block level failure following programming the set of word lines while applying the first voltage to the source line. The method comprises identifying a subset of the blocks having the block level failure that meet a failure criterion with respect to memory operations performed within the set of word lines. The method comprises applying a second voltage to the source line while programming the set of word lines in the subset of the blocks responsive to the subset of the blocks comprising a threshold number of blocks.

An embodiment includes a non-volatile storage system. The system comprises a three-dimensional NAND memory structure having blocks. Each block comprises NAND strings above a source line. Each NAND string has a NAND channel. The system comprises a first voltage generator configured to output a first voltage and a second voltage generator configured to output a second voltage. The system comprises one or more control circuits in communication with the three-dimensional NAND memory structure, the first voltage generator, and the second voltage generator. The one or more control circuits are configured to pre-charge the NAND channels of unselected NAND strings in the blocks using the first voltage from the first voltage generator for a set of program voltages when programming a set of word lines in the blocks. The one or more control circuits are configured to identify blocks that are candidates to retire following programming that includes using the first voltage from the first voltage generator for the set of program voltages when programming the set of word lines in the blocks. The one or more control circuits are configured to identify a subset of the blocks that are candidates to retire that fail to meet a reliability criterion within the set of word lines. The one or more control circuits are configured to pre-charge the NAND channels of unselected NAND strings in the subset that are candidates to retire using the second voltage from the second voltage generator for the set of program voltages when programming the set of word lines of the subset that are candidates to retire.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

one or more control circuits configured to connect to a three-dimensional memory structure, the memory structure having blocks of memory cells in a plane on a die, the blocks associated with a source line, the one or more control circuits configured to:

program a target region within the blocks in the plane with a first programming technique that applies a first voltage having a first magnitude to a control line in the blocks;

determine that there is evidence of a plane or die level failure responsive to a threshold number of the blocks failing to meet a reliability criterion with respect to memory operation failures within the target region; and program the target region within at least a subset of the blocks in the plane with a second programming technique responsive to detecting the evidence of the plane or die level failure, the second programming technique applies a second voltage having a second magnitude to the control line in the blocks.

2. The apparatus of claim 1, wherein the one or more control circuits are further configured to:

select first circuitry for providing a the first voltage to a the control line in the blocks for the first programming technique; and select second circuitry for providing a the second voltage to the control line in the blocks for the second programming technique.

3. The apparatus of claim 1, wherein the one or more control circuits are further configured to:

test the subset of the blocks for the reliability criterion after programming the target region within the subset of the blocks with the second programming technique; and continue to use the second programming technique in the target region for blocks in the subset that passed the reliability criterion.

4. The apparatus of claim 3, wherein the one or more control circuits are further configured to:

program the target region within all good blocks in the plane with the second programming technique responsive to use of the second programming technique within the target region overcoming the plane or die level failure.

5. The apparatus of claim 1, wherein:

the first program technique includes applying the first voltage to the source line for a set of program voltages; and the second program technique includes applying the second voltage to the source line for the set of program voltages, the second magnitude is less than the first magnitude.

6. The apparatus of claim 5, wherein:

the one or more control circuits further comprise:

a first voltage generator configured to output the first voltage, the first voltage generator having a first DC drive strength;

a second voltage generator configured to output the second voltage, the second voltage generator having a second DC drive strength that is greater than the first DC drive strength; and the one or more control circuits are further configured to select the first voltage generator prior to the evidence of the plane or the die level failure and to select the second voltage generator responsive to the evidence of the plane or the die level failure.

7. The apparatus of claim 1, wherein:

the first program technique includes applying a first pre-charge voltage to NAND channels in the blocks; and the second program technique includes applying a second pre-charge voltage to NAND channels in the blocks, the second pre-charge voltage being less than the first pre-charge voltage.

8. The apparatus of claim 7, wherein:

the one or more control circuits further comprises:

a first voltage generator configured to provide a first electron pre-charge to the NAND channels in the blocks in the plane, the first voltage generator having a first DC drive strength;

a second voltage generator configured to provide a second electron pre-charge to the NAND channels in the blocks in the plane that is less than the first electron pre-charge, the second voltage generator having a second DC drive strength that is greater than the first DC drive strength; and the one or more control circuits are configured to use the first voltage generator to provide the first electron pre-charge and to use the second voltage generator to provide the second electron pre-charge.

9. The apparatus of claim 1, wherein the target region of the blocks comprises a set of word lines adjacent to the source line.

10. A method for operating NAND memory, the method comprising:

for each block of a plurality of blocks in a plane of the NAND memory, applying a first voltage having a first magnitude to a source line in the NAND memory while programming a set of word lines in each respective block in the plurality of blocks;

identifying a count of blocks in the plane having a block level failure following programming the set of word lines while applying the first voltage to the source line; and applying a second voltage having a second magnitude less than the first magnitude to the source line while programming the set of word lines in the blocks having the block level failure responsive to the count being greater than a limit.

11. The method of claim 10, further comprising:

testing the blocks having the block level failure for a reliability criterion after programming the set of word lines while applying the second voltage to the source line; and continuing to use blocks in the blocks having the block level failure that meet the reliability criterion when programming the set of word lines while applying the second voltage to the source line despite the block level failure.

12. The method of claim 11, further comprising:

applying the second voltage to the source line while programming the set of word lines in all of the blocks in the plane responsive the blocks having the block level failure meeting the reliability criterion after programming the set of word lines while applying the second voltage to the source line.

13. The method of claim 10, further comprising:

applying the second voltage to the source line in the NAND memory while programming word lines other than the set of word lines in the blocks of the NAND memory prior to the blocks having the block level failure; and applying the second voltage to the source line in the NAND memory while programming word lines other than the set of word lines in the blocks of the NAND memory responsive to the count subset of the blocks having the block level failure being greater than the limit.

14. The method of claim 13, wherein:

applying the first voltage to the source line in the NAND memory while programming the set of word lines in blocks of the NAND memory comprises providing the first voltage from a first voltage source having a first drive strength; and applying the second voltage to the source line in the NAND memory while programming the set of word lines in the blocks having the block level failure comprises providing the second voltage from a second voltage source having a second drive strength that is greater than the first drive strength.

15. A non-volatile storage system, the system comprising:

a three-dimensional NAND memory structure having blocks, each block comprising NAND strings above a source line, each NAND string having a NAND channel;

a first voltage generator configured to output a first voltage having a first magnitude;

a second voltage generator configured to output a second voltage having a second magnitude smaller than the first magnitude; and one or more control circuits in communication with the three-dimensional NAND memory structure, the first voltage generator, and the second voltage generator, wherein the one or more control circuits are configured to:

pre-charge the NAND channels of unselected NAND strings in the blocks using the first voltage from the first voltage generator for a set of program voltages when programming a set of word lines in the blocks;

identify blocks that are candidates to retire following programming that includes using the first voltage from the first voltage generator for the set of program voltages when programming the set of word lines in the blocks;

identify a subset of the blocks that are candidates to retire that fail to meet a reliability criterion within the set of word lines; and pre-charge the NAND channels of unselected NAND strings in the subset that are candidates to retire using the second voltage from the second voltage generator for the set of program voltages when programming the set of word lines of the subset that are candidates to retire.

16. The non-volatile storage system of claim 15, wherein the one or more control circuits are further configured to:

place blocks in the subset that are candidates to retire that pass the reliability criterion after programming the set of the word lines using the second voltage into a pool that continue to be eligible for use providing that the second voltage from the second voltage generator continues to be used to program the set of word lines.

17. The non-volatile storage system of claim 15, wherein the one or more control circuits are further configured to:

place blocks in the subset that are candidates to retire that fail the reliability criterion after programming the set of the word lines using the second voltage into a pool that are not eligible for use.

18. The non-volatile storage system of claim 15, wherein:

the first voltage generator has a first DC drive strength; and the second voltage has a second DC drive strength that is greater than the first DC drive strength.

19. The non-volatile storage system of claim 15, wherein:

the first voltage generator provides a first electron pre-charge of the NAND channels of the unselected NAND strings; and the second voltage generator provides a second electron pre-charge of the NAND channels of the unselected NAND strings that is less than the first electron pre-charge.

* * * * *